US012666647B2

(12) United States Patent
Chang et al.

(10) Patent No.: US 12,666,647 B2
(45) Date of Patent: Jun. 23, 2026

(54) TRANSISTOR INCLUDING BOTTOM ISOLATION AND MANUFACTURING METHOD THEREOF

(71) Applicant: Taiwan Semiconductor Manufacturing Co., Ltd., Hsinchu (TW)

(72) Inventors: Jung-Hung Chang, Hsinchu (TW); Zhi-Chang Lin, Hsinchu (TW); Shih-Cheng Chen, Hsinchu (TW); Chien Ning Yao, Hsinchu (TW); Kuo-Cheng Chiang, Hsinchu (TW); Chih-Hao Wang, Hsinchu (TW); Chia-Pin Lin, Hsinchu (TW); Wei-Yang Lee, Hsinchu (TW); Yen-Sheng Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1182 days.

(21) Appl. No.: 17/548,179

(22) Filed: Dec. 10, 2021

(65) Prior Publication Data

US 2022/0336612 A1     Oct. 20, 2022

Related U.S. Application Data

(60) Provisional application No. 63/176,090, filed on Apr. 16, 2021.

(51) Int. Cl.
| | |
|---|---|
| *H10D 30/67* | (2025.01) |
| *H10D 62/10* | (2025.01) |
| *H10D 84/01* | (2026.01) |
| *H10D 84/03* | (2025.01) |
| *H10D 84/83* | (2025.01) |

(52) U.S. Cl.
CPC ..... *H10D 30/6735* (2025.01); *H10D 30/6757* (2025.01); *H10D 62/118* (2025.01); *H10D 84/0128* (2025.01); *H10D 84/013* (2025.01); *H10D 84/038* (2025.01); *H10D 84/83* (2025.01)

(58) Field of Classification Search
CPC ........... H10D 30/6735; H10D 84/0128; H10D 84/013; H10D 64/017; H10D 30/6713; H10D 84/017
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |

(Continued)

*Primary Examiner* — Jacob Y Choi
*Assistant Examiner* — Aaron Michael Wegner
(74) *Attorney, Agent, or Firm* — Seed IP Law Group

(57) ABSTRACT

An integrated circuit includes a first nanostructure transistor and a second nanostructure transistor on a substrate. The source/drain regions of the first nanostructure are electrically isolated from the semiconductor substrate by bottom dielectric regions. The source/drain regions of the second nanostructure transistor in direct contact with the semiconductor substrate.

20 Claims, 22 Drawing Sheets

(56)                   References Cited

U.S. PATENT DOCUMENTS

| | | | |
|---|---|---|---|
| 9,853,101 B2 | 12/2017 | Peng et al. | |
| 9,881,993 B2 | 1/2018 | Ching et al. | |
| 9,947,804 B1 * | 4/2018 | Frougier | H10D 30/6743 |
| 2018/0301564 A1 * | 10/2018 | Kwon | H10D 64/017 |
| 2020/0135853 A1 * | 4/2020 | Bao | H01L 21/02603 |
| 2021/0384306 A1 * | 12/2021 | Xie | H10D 62/151 |
| 2022/0230922 A1 * | 7/2022 | Chen | H10D 30/6735 |
| 2022/0310602 A1 * | 9/2022 | Greene | H10D 62/115 |

* cited by examiner

400

FORM A FIRST CHANNEL REGION OF A FIRST TRANSISTOR ABOVE A SEMICONDUCTOR SUBSTRATE

402

FORM A BOTTOM DIELECTRIC REGION ON THE SEMICONDUCTOR SUBSTRATE

404

FORM A FIRST SOURCE/DRAIN REGION OF THE FIRST TRANSISTOR ON THE BOTTOM DIELECTRIC REGION AND COUPLED TO THE FIRST CHANNEL REGION

406

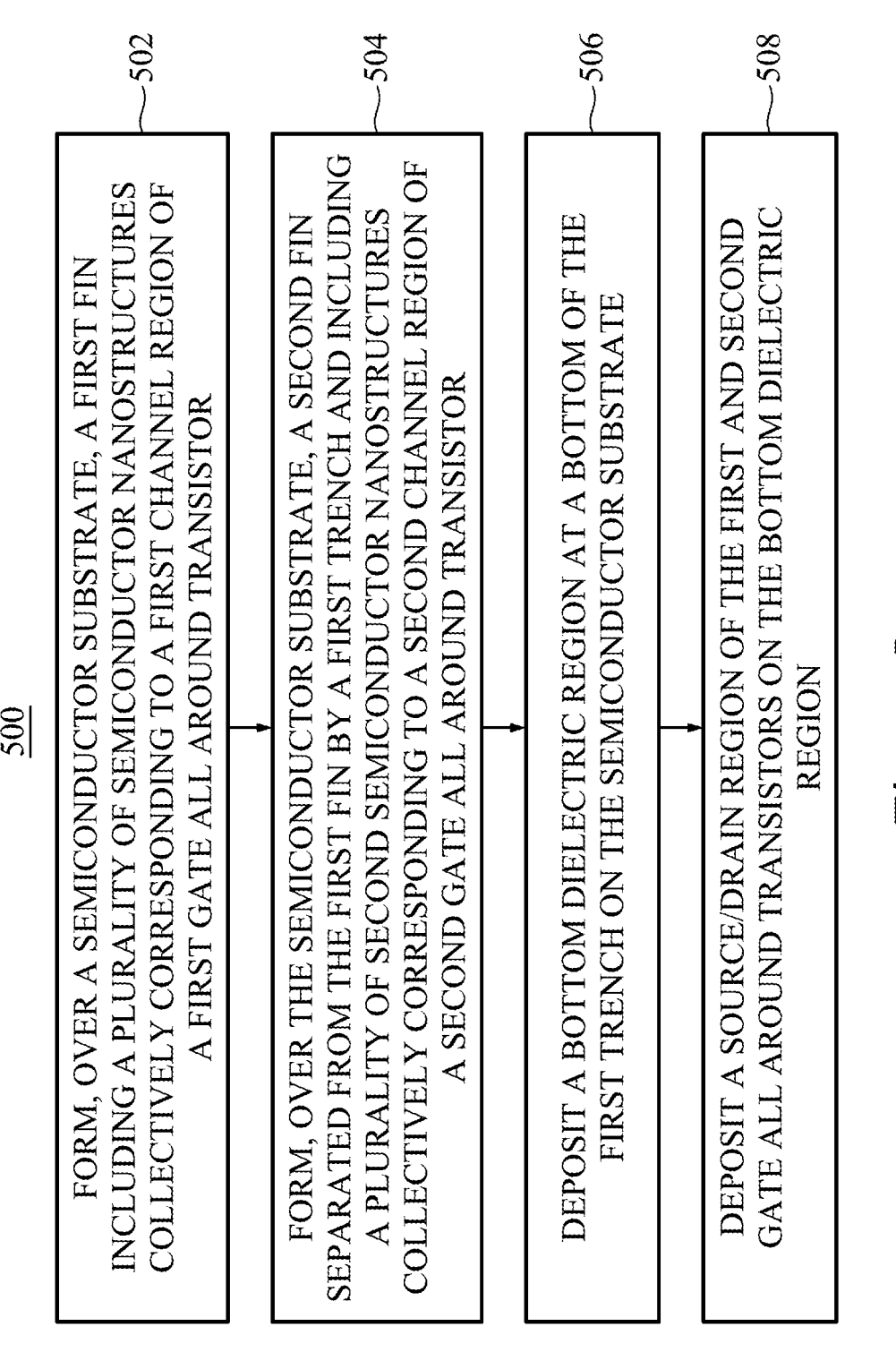

500

FORM, OVER A SEMICONDUCTOR SUBSTRATE, A FIRST FIN INCLUDING A PLURALITY OF SEMICONDUCTOR NANOSTRUCTURES COLLECTIVELY CORRESPONDING TO A FIRST CHANNEL REGION OF A FIRST GATE ALL AROUND TRANSISTOR
502

FORM, OVER THE SEMICONDUCTOR SUBSTRATE, A SECOND FIN SEPARATED FROM THE FIRST FIN BY A FIRST TRENCH AND INCLUDING A PLURALITY OF SECOND SEMICONDUCTOR NANOSTRUCTURES COLLECTIVELY CORRESPONDING TO A SECOND CHANNEL REGION OF A SECOND GATE ALL AROUND TRANSISTOR
504

DEPOSIT A BOTTOM DIELECTRIC REGION AT A BOTTOM OF THE FIRST TRENCH ON THE SEMICONDUCTOR SUBSTRATE
506

DEPOSIT A SOURCE/DRAIN REGION OF THE FIRST AND SECOND GATE ALL AROUND TRANSISTORS ON THE BOTTOM DIELECTRIC REGION
508

Figure 5

TRANSISTOR INCLUDING BOTTOM ISOLATION AND MANUFACTURING METHOD THEREOF

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow diagram of a process for forming an integrated circuit, in accordance with some embodiments.

DETAILED DESCRIPTION

Figure 1:
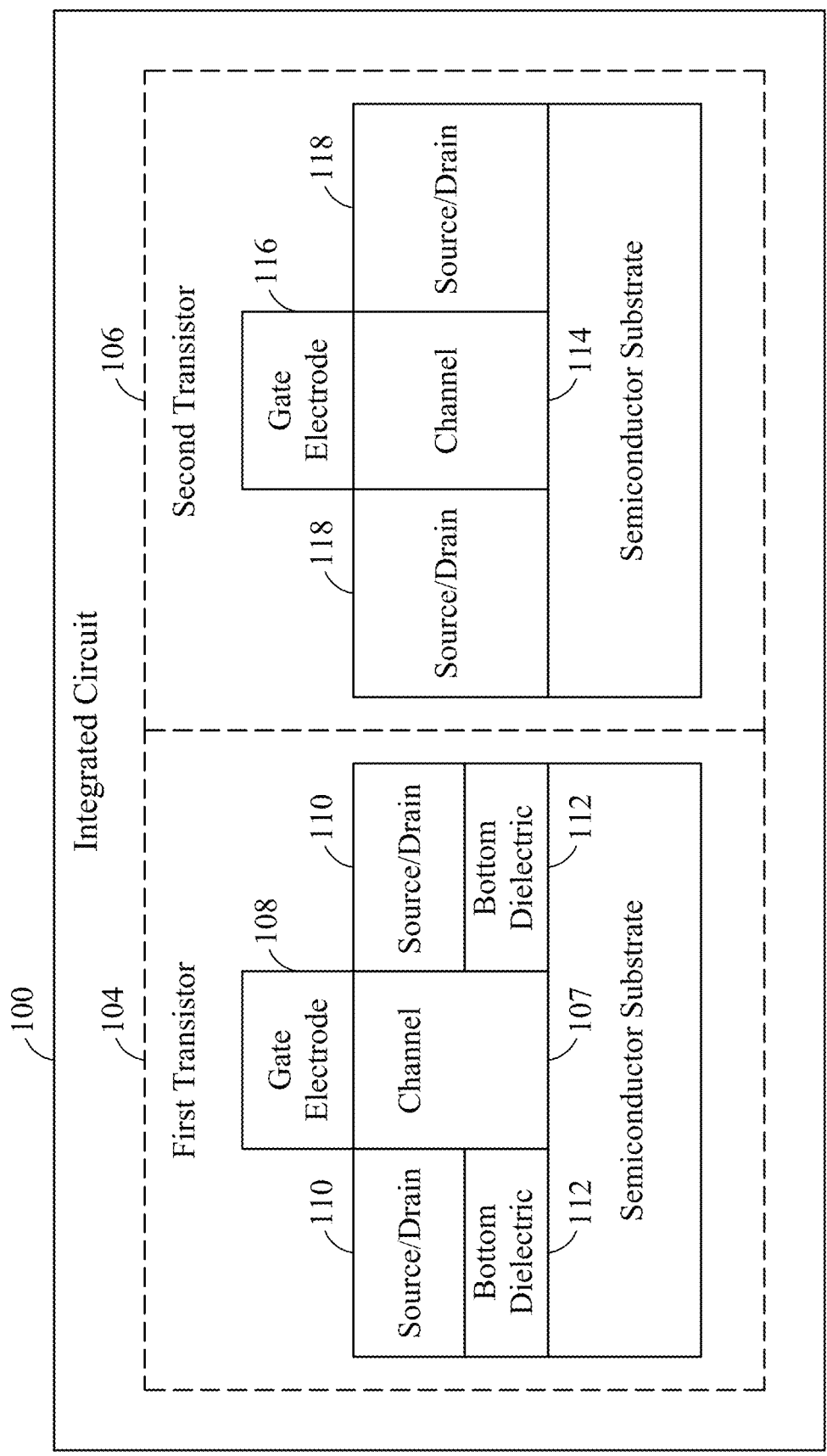
FIG. 1 is a block diagram of an integrated circuit 100, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions above the semiconductor substrate and in contact with the nanostructures. Embodiments of the present disclosure reduce leakage currents from the source/drain regions by forming a bottom dielectric region between a bottom of the source/drain regions and the semiconductor substrate. The bottom dielectric regions prevent the flow of leakage currents from the source/drain regions to the semiconductor substrate because no current will flow through the bottom dielectric regions. This can greatly improve the overall functionality of the integrated circuit by substantially eliminating a major source of power consumption. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

FIG. 1 is a block diagram of an integrated circuit 100, in accordance with some embodiments. The integrated circuit 100 includes a semiconductor substrate 102. The integrated circuit also includes a first transistor 104 and a second transistor 106 above the semiconductor substrate 102. As set forth in more detail below, the integrated circuit 100 selectively utilizes dielectric regions to improve the performance of the first transistor 104 without harming the performance of the second transistor 106.

The first transistor 104 includes a channel region 107, a gate electrode 108, and source/drain regions 110. The first transistor 104 can be operated by applying a voltage to the gate electrode 108. This can prevent or enable current to flow between the source/drain regions 110 through the channel 107.

The first transistor 104 also includes bottom dielectric regions 112 below the source/drain regions 110. In particular, a respective bottom dielectric region 112 is positioned between the semiconductor substrate 102 and each of the source/drain regions 110. The bottom dielectric regions 112 may be positioned in contact with a top surface of the semiconductor substrate 102 and the bottom surfaces of the source/drain regions 110.

The presence of the bottom dielectric regions 112 ensures that leakage currents will not flow from the source/drain regions 110 into the semiconductor substrate 102. This can greatly enhance the efficiency of the first transistor 104 by substantially eliminating leakage currents. This reduces power consumption and heat generation.

In practice, the integrated circuit 100 may have a very large number of transistors of the same type as the first transistor 104. Each of these transistors may have the bottom dielectric region 112 to help prevent leakage currents. Accordingly, the bottom dielectric region 112 can be utilized to substantially eliminate leakage current from thousands or millions of transistors of a same type as the first transistor 104 in the integrated circuit 100. This results in a very large reduction in power consumption and heat generation for the integrated circuit 100.

The second transistor 106 includes a channel region 114, a gate electrode 116, and source/drain regions 118. The second transistor 106 can be operated by applying a voltage to the gate electrode 116. This can prevent or enable current to flow between the source/drain regions 118 through the channel region 114.

The second transistor 106 differs from the first transistor 104 in that the bottom dielectric regions 112 are not present in the second transistor 106. Accordingly, the source/drain regions 118 may be positioned directly on the semiconductor substrate 102. In some embodiments, the second transistor 106 is of a different type than the first transistor 104. There may be benefits to the second transistor 106 in maintaining direct contact between the source/drain regions 118 and the semiconductor substrate 102. Accordingly, the second transistor 106 is formed without the bottom dielectric regions 112. The integrated circuit 100 may include a large number of transistors of the same type as the second transistor 106.

In some embodiments, the first transistor 104 is an N-type transistor and the second transistor 106 is a P-type transistor.

In this case, the source and drain regions 110 of the first transistor 104 may be doped with N-type dopants species. The source/drain regions 118 of the second transistor 106 may be doped with P-type dopant species. In some cases, N-type transistors may be more susceptible to leakage currents from source/drain regions 110 into the semiconductor substrate. Accordingly, utilizing bottom dielectric regions 112 in N-type transistors of the integrated circuit 100 may result in a large reduction in leakage currents and corresponding overall power dissipation in heat generation.

P-type transistors may be less susceptible to leakage currents from source/drain regions into a semiconductor substrate. Accordingly, there may be less benefit in utilizing bottom dielectric regions for the transistor 106. Furthermore, the P-type second transistor 106 may benefit from strain imparted on the source/drain regions 118 by the semiconductor substrate 102. The strain can be introduced by a mismatch in crystal lattices between the semiconductor substrate 102 and the source/drain regions 118. In particular, if the semiconductor substrate 102 has a larger crystal lattice structure then the source/drain regions 118, then the semiconductor substrate 102 may impart a tensile strain onto the source/drain regions 118, thereby improving conductivity of the source/drain regions 118. In other examples, the mismatch between crystal glasses of the semiconductor substrate 102 and the source/drain regions 118 may introduce compressive strain onto the source/drain regions 118. In any case, the presence of a bottom dielectric region between the source/drain regions 118 and the semiconductor substrate 102 would result in no tensile or compressive strain being imparted to the source/drain regions 118. Therefore, in some embodiments, it is beneficial to have no bottom dielectric region separating the source/drain regions 118 from the semiconductor substrate 102.

In some embodiments, the first and second transistors 104 and 106 are nanostructure transistors. In this case, the channel regions 107 and 114 are each made of a plurality of semiconductor nanostructures extending between the source/drain regions 110 in the case of the first transistor 104, and between the source/drain regions 118 in the case of the second transistor 106. The semiconductor nanostructures may include nanosheets, nanowires, or other types of nanostructures. The channel regions 107 and 114 may be part of respective fin structures extending above the semiconductor substrate 102. Other types of transistors may be utilized without departing from the scope of the present disclosure.

Figure 2A:
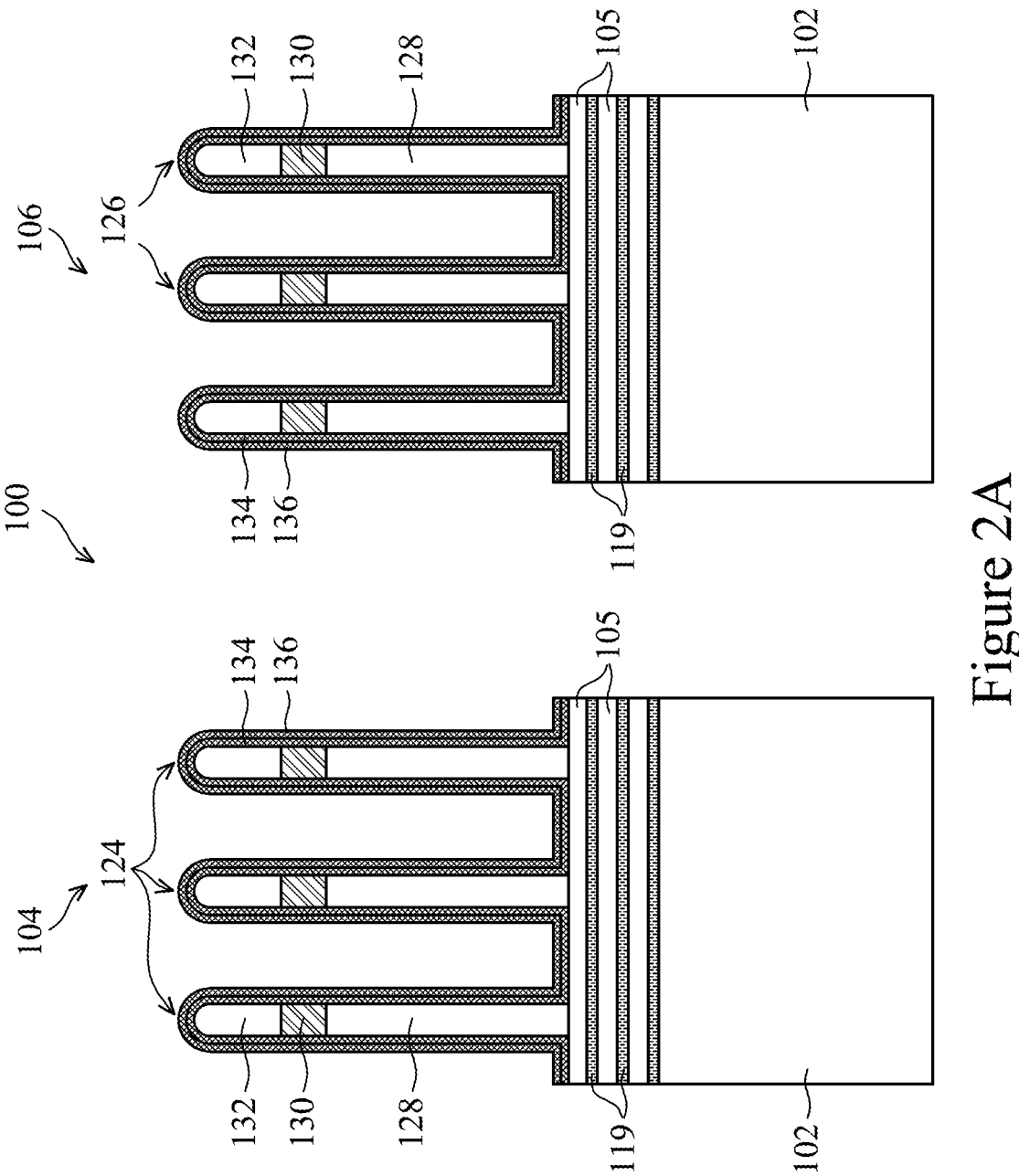
FIGS. 2A-2Q are cross-sectional views of an integrated circuit, at various stages of processing, in accordance with some embodiments.
Figure 2B:
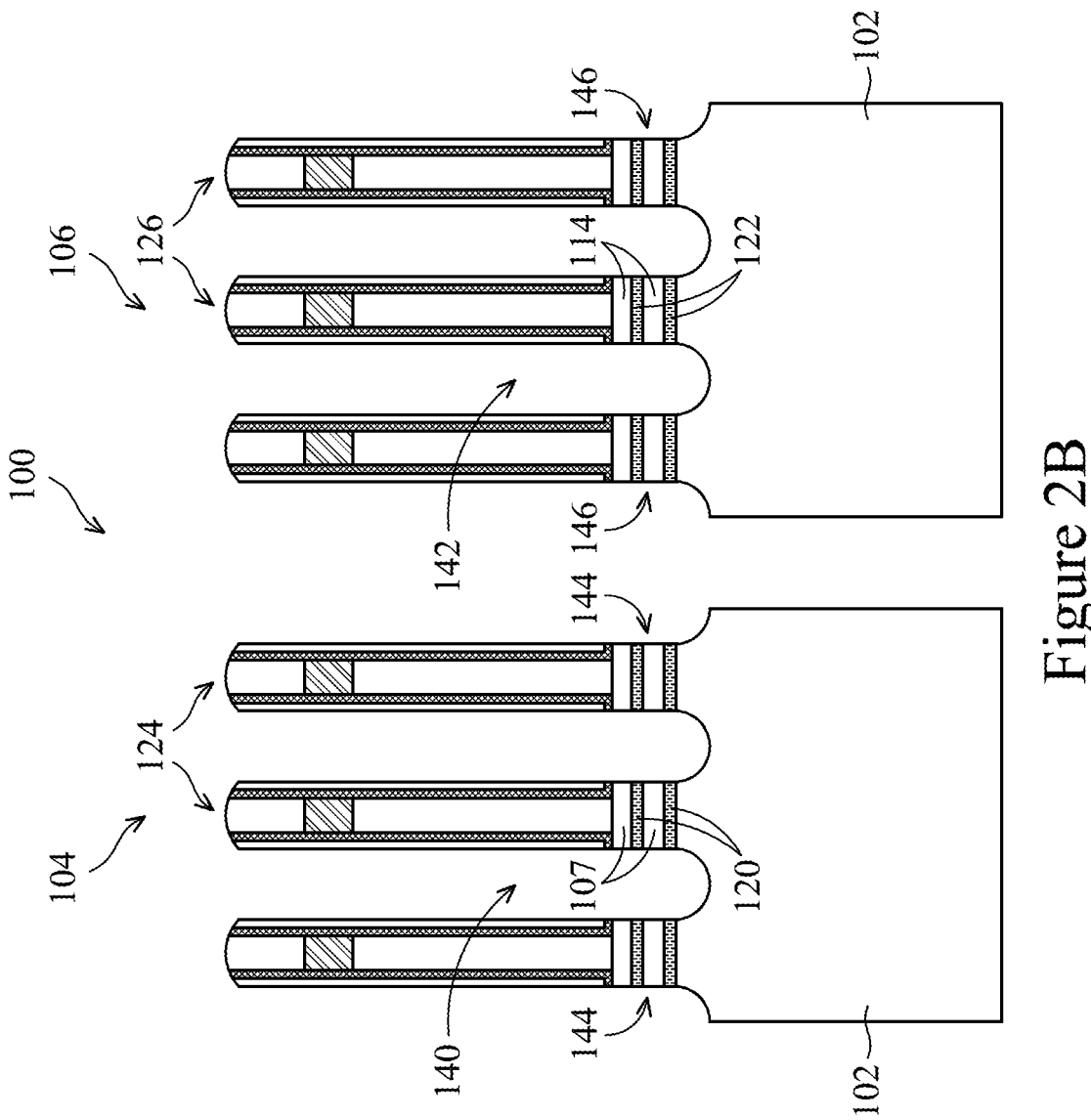
Figure 2C:
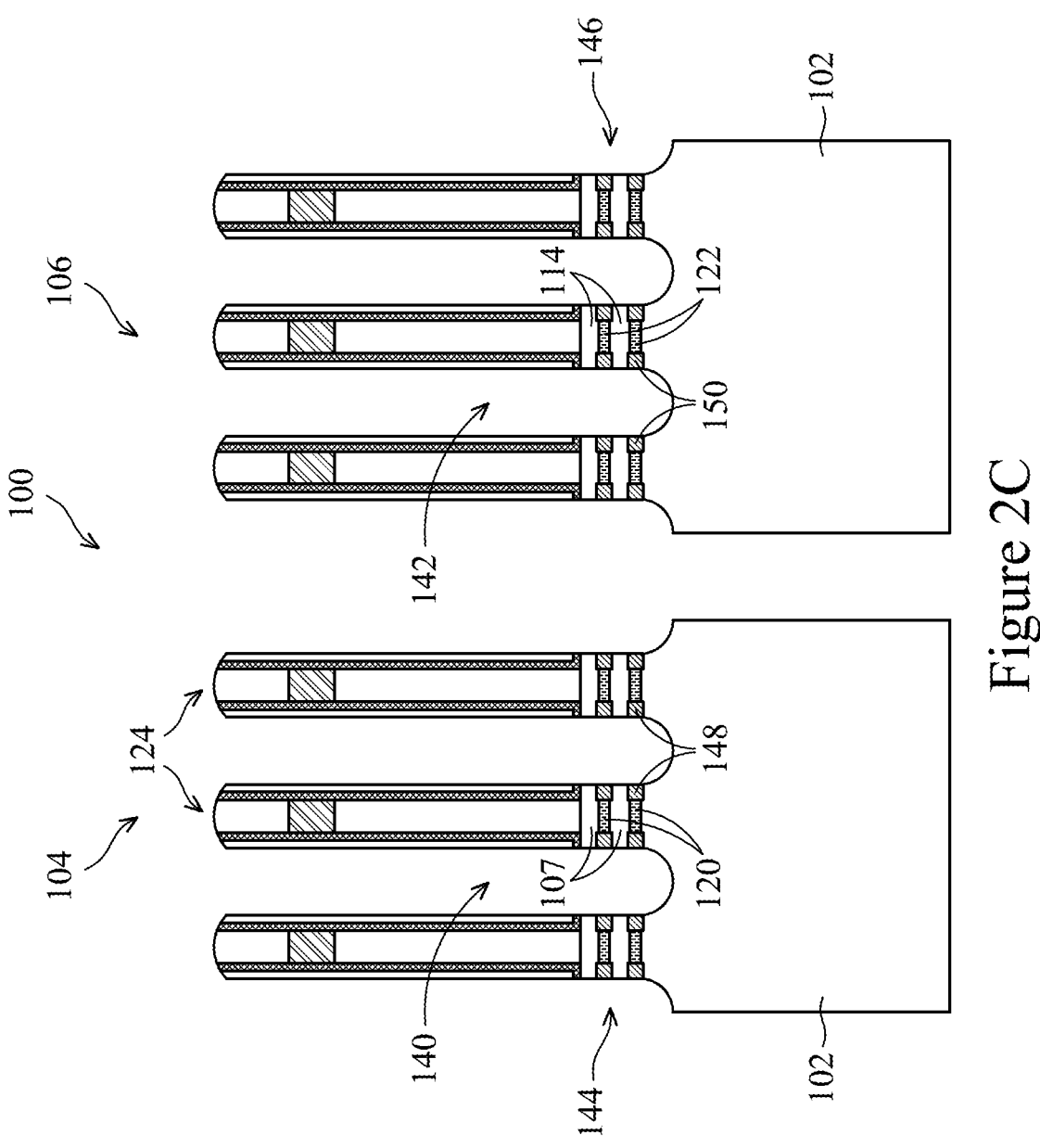
Figure 2D:
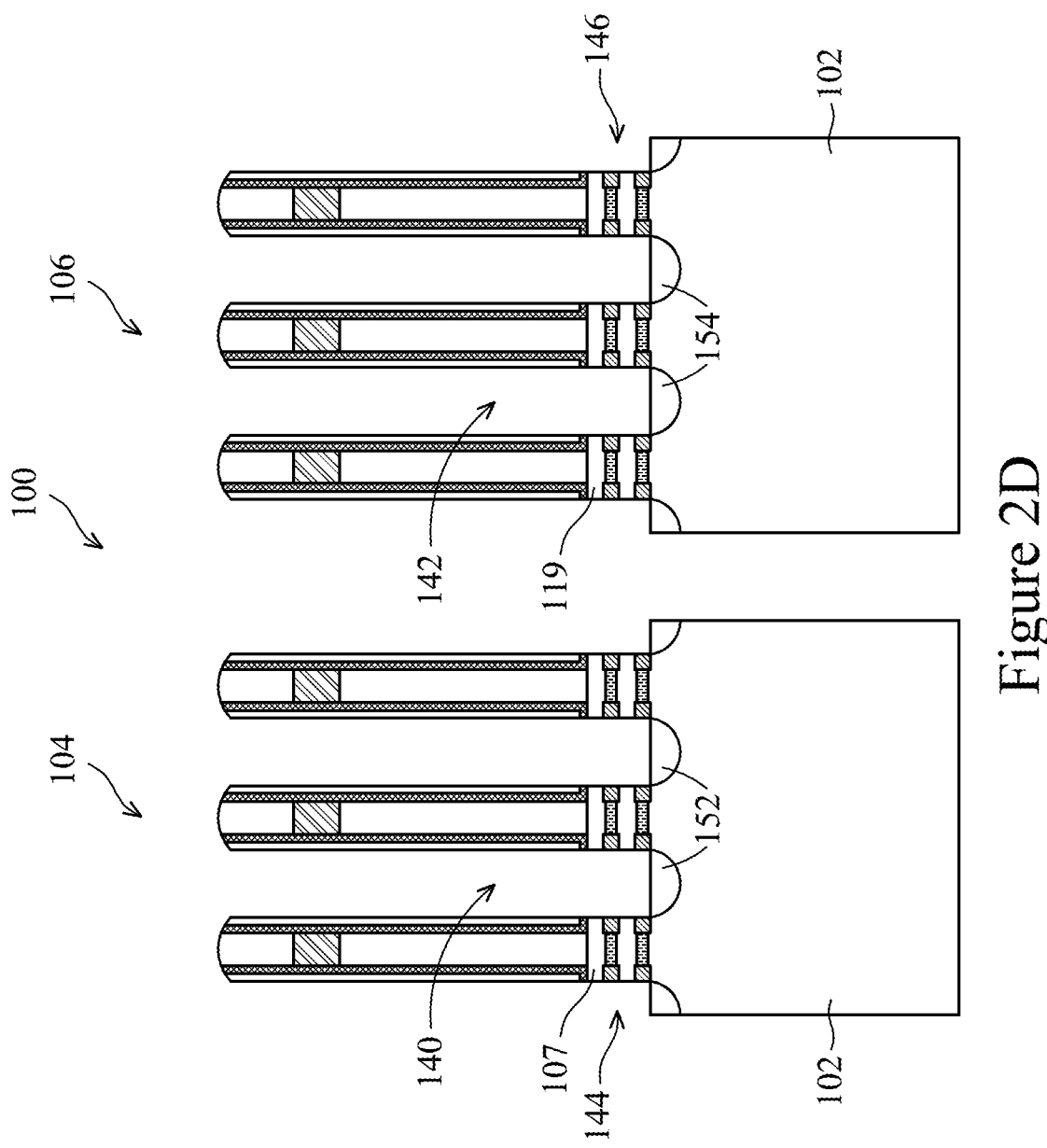
Figure 2E:
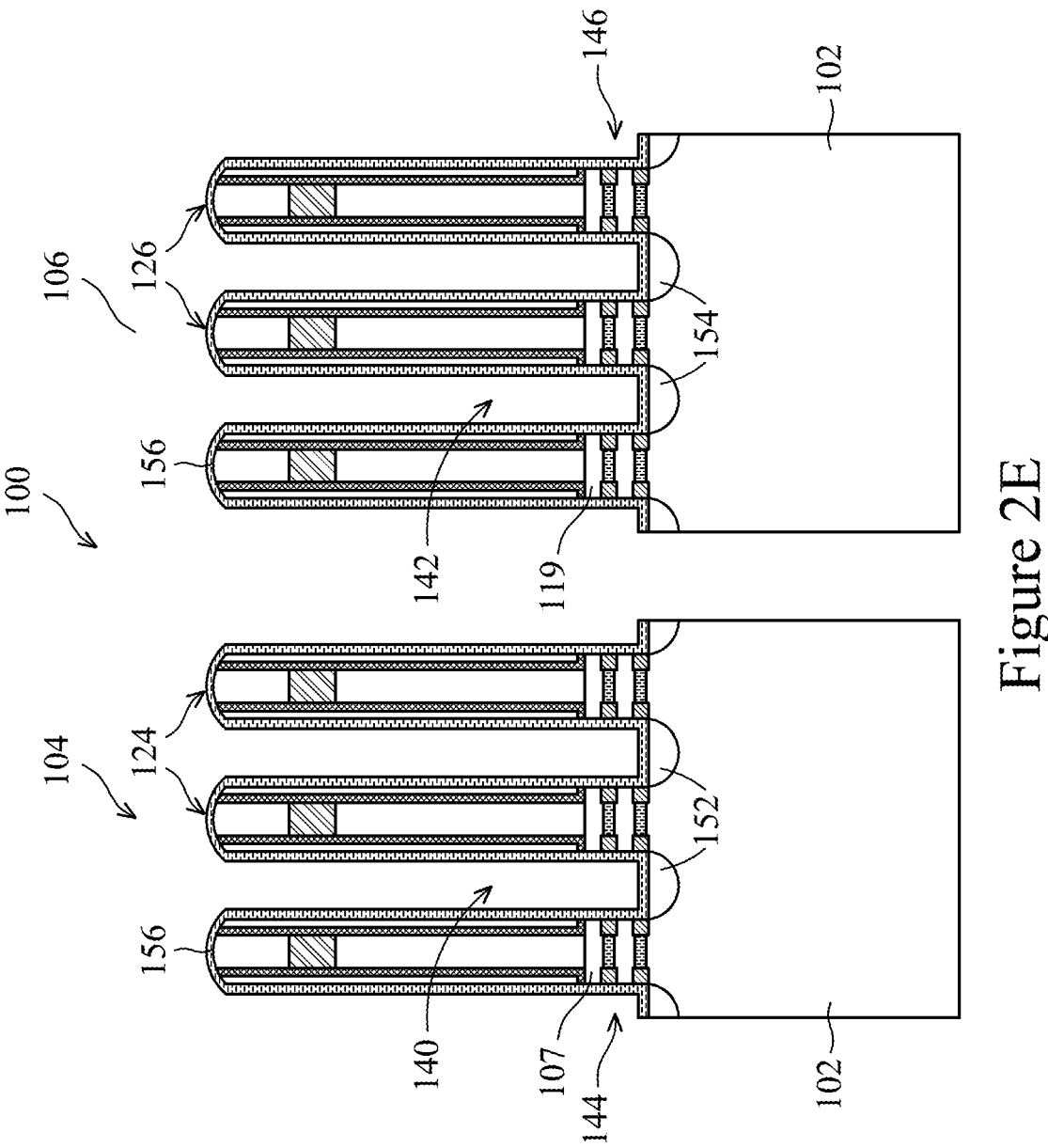
Figure 2F:
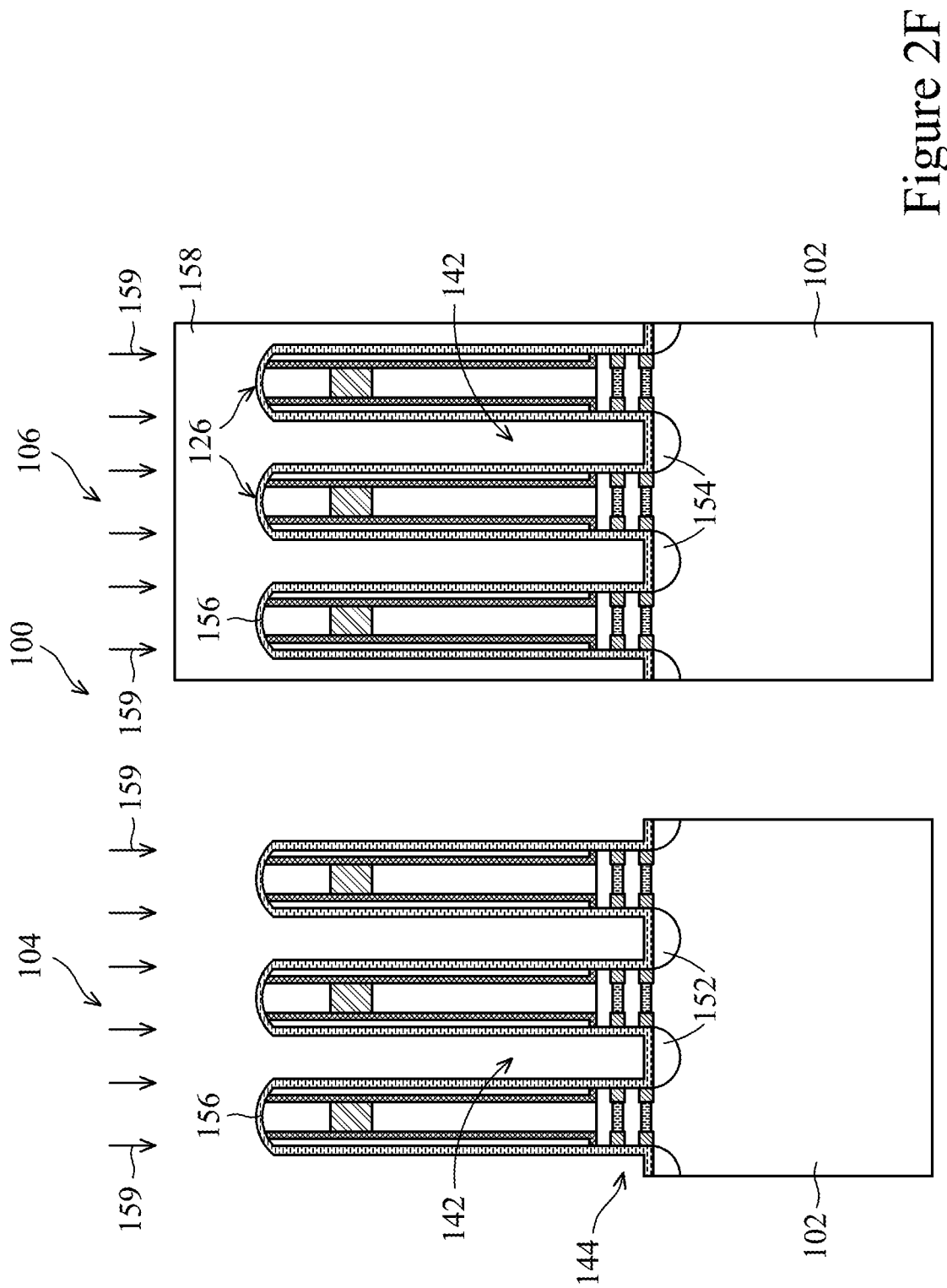
Figure 2G:
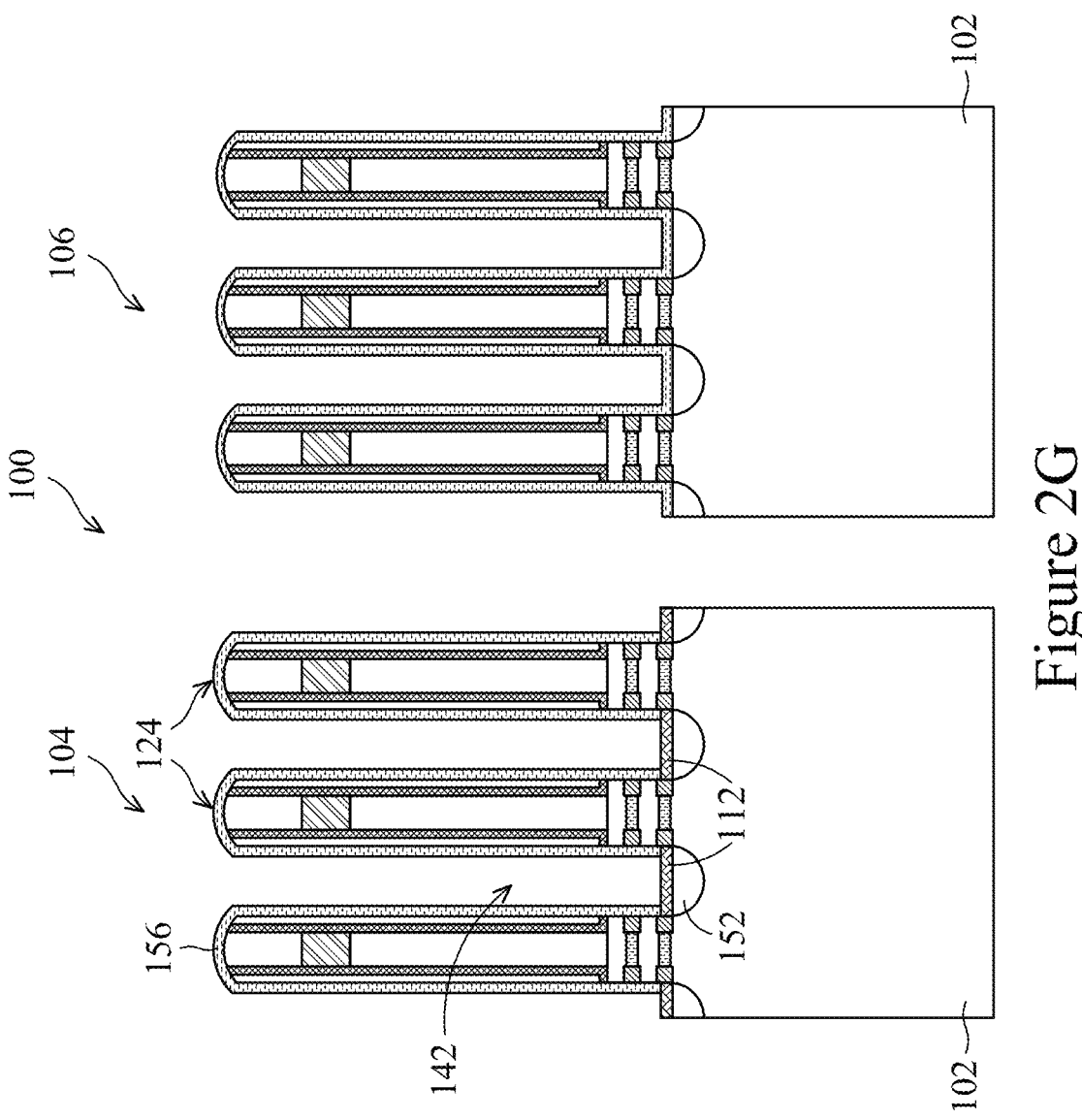
Figure 2H:
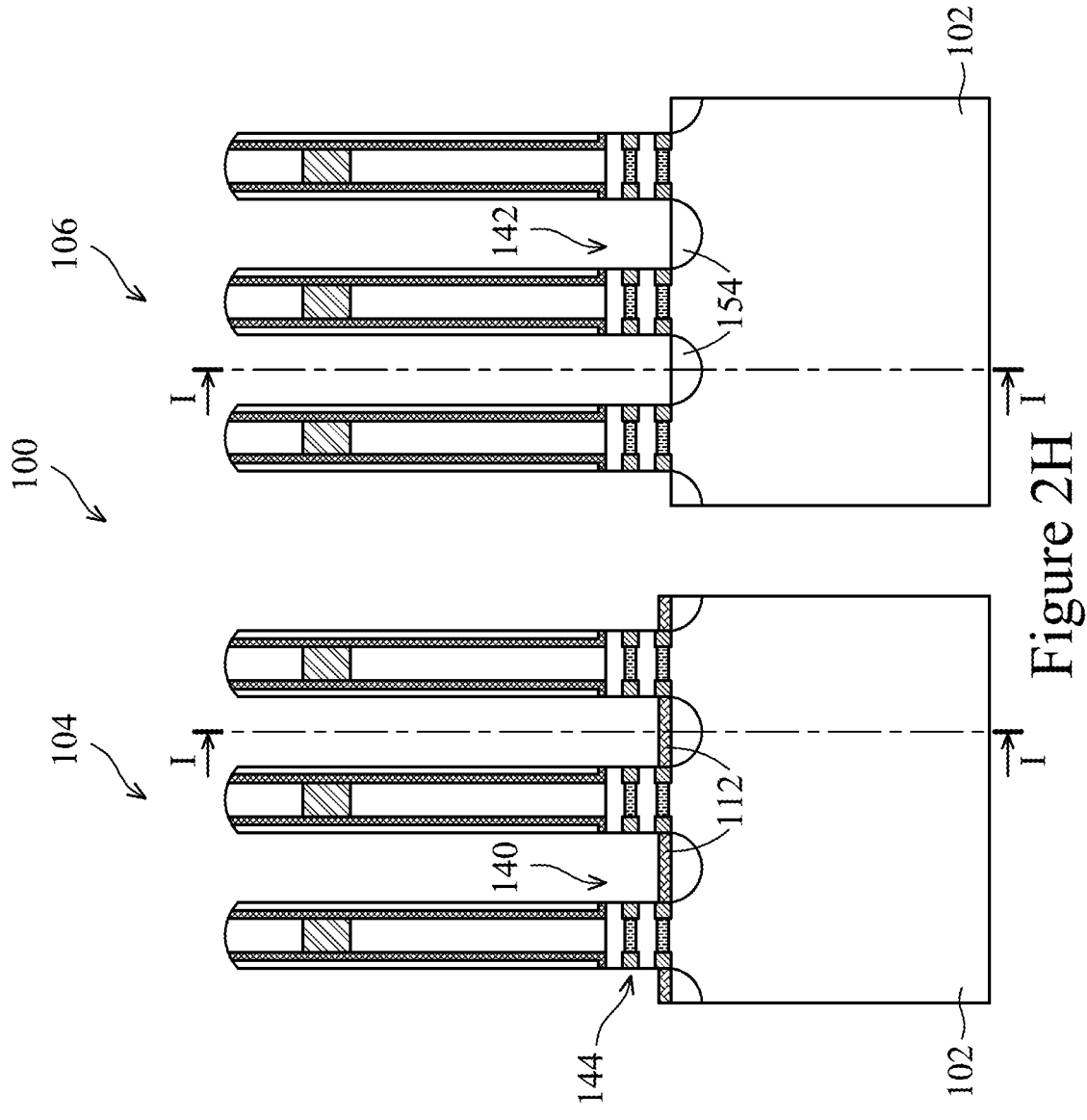
Figure 2I:
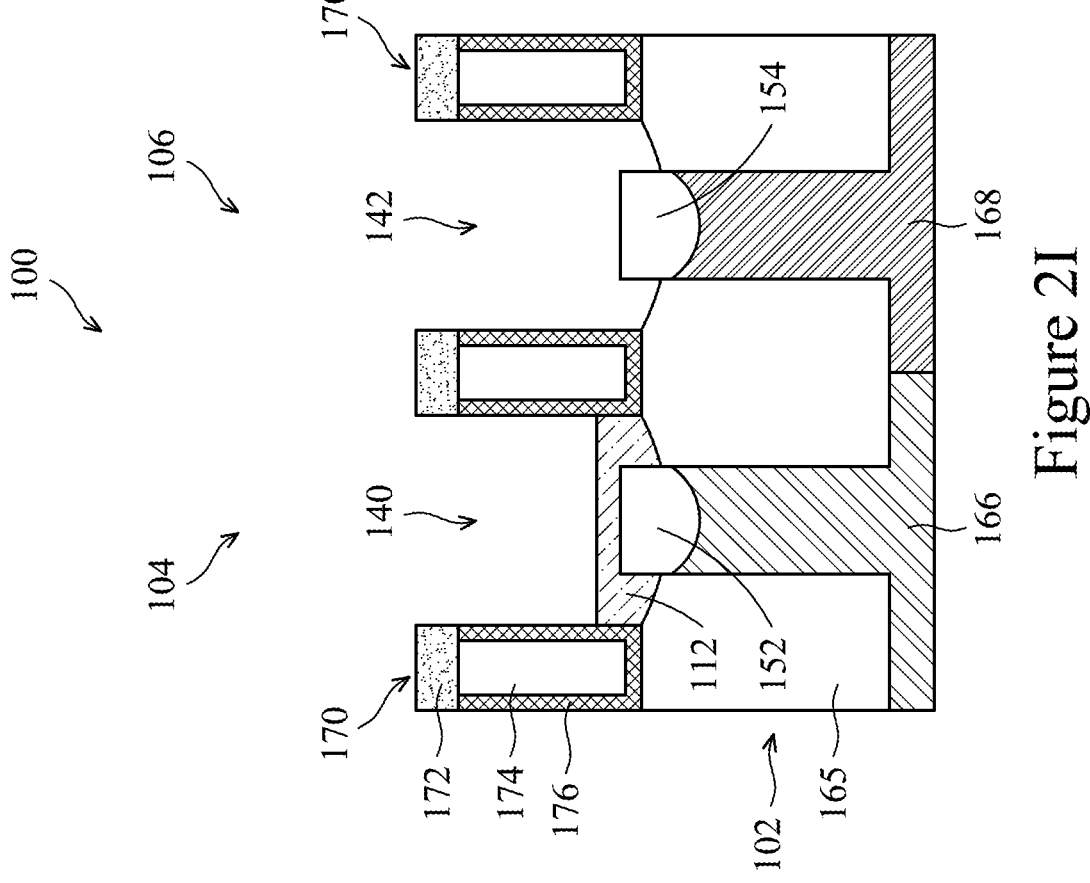
Figure 2J:
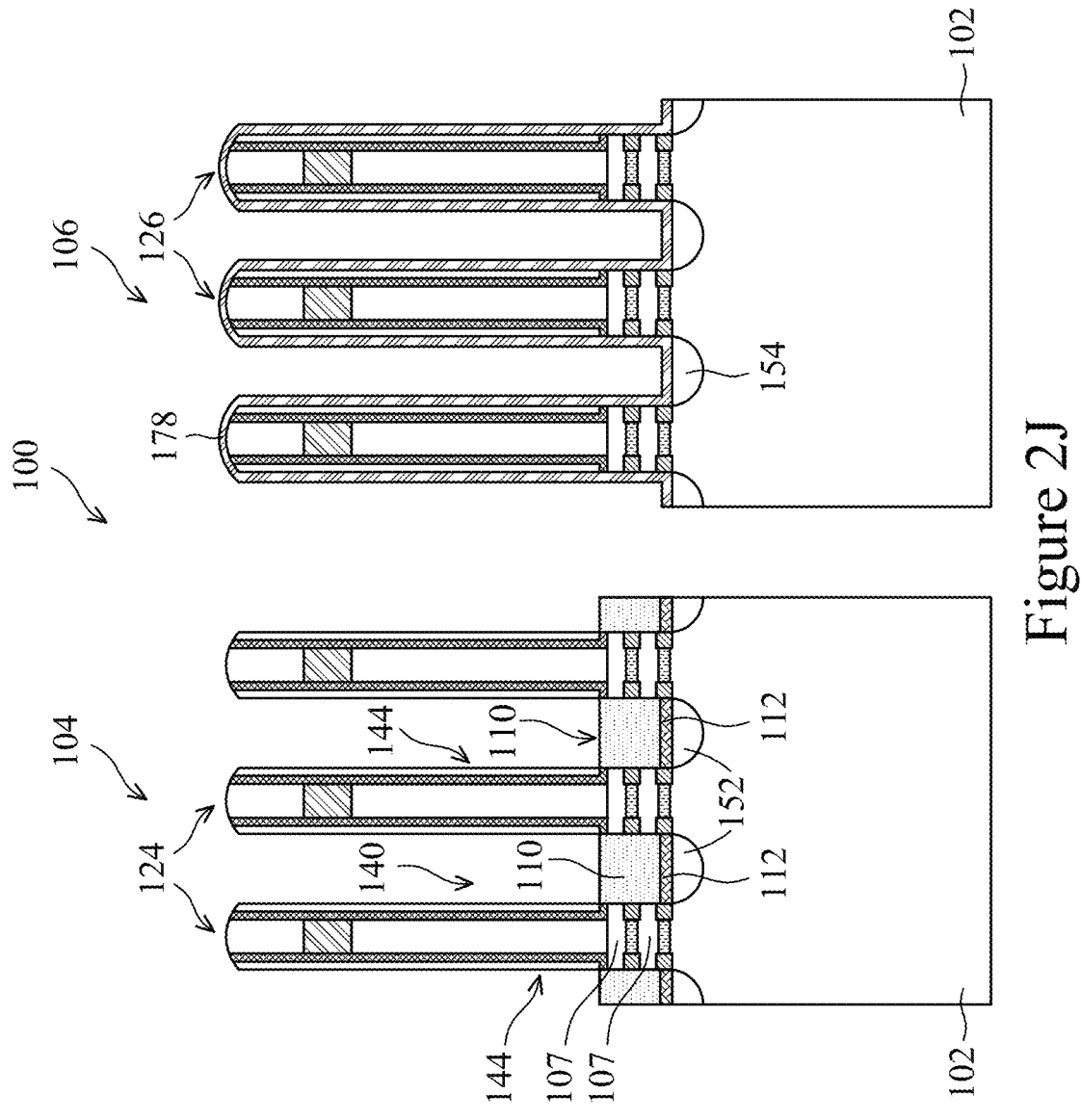
Figure 2K:
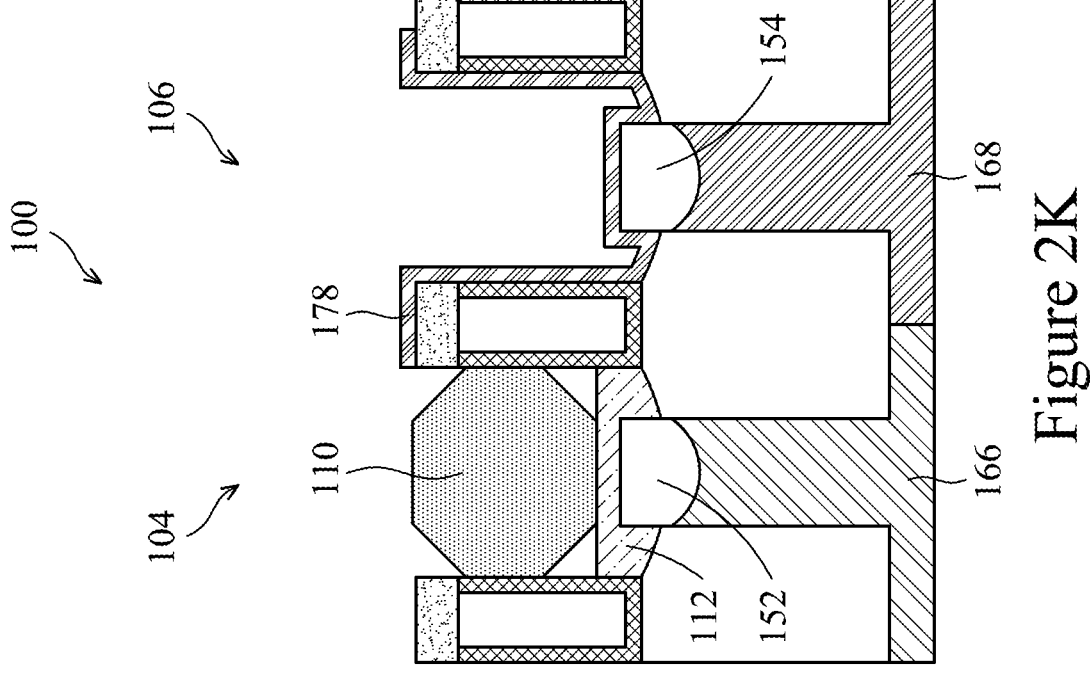
Figure 2L:
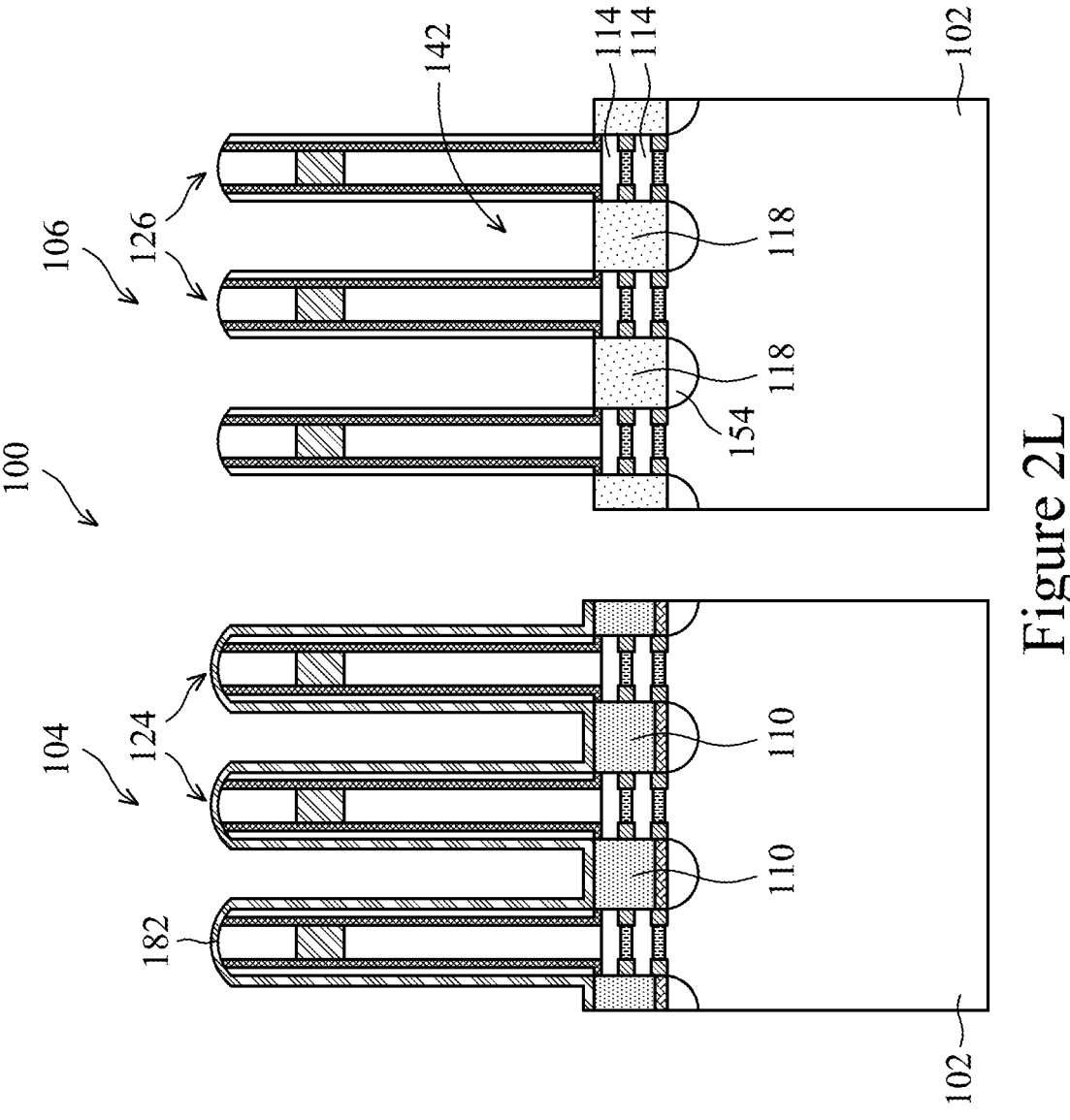
Figure 2M:
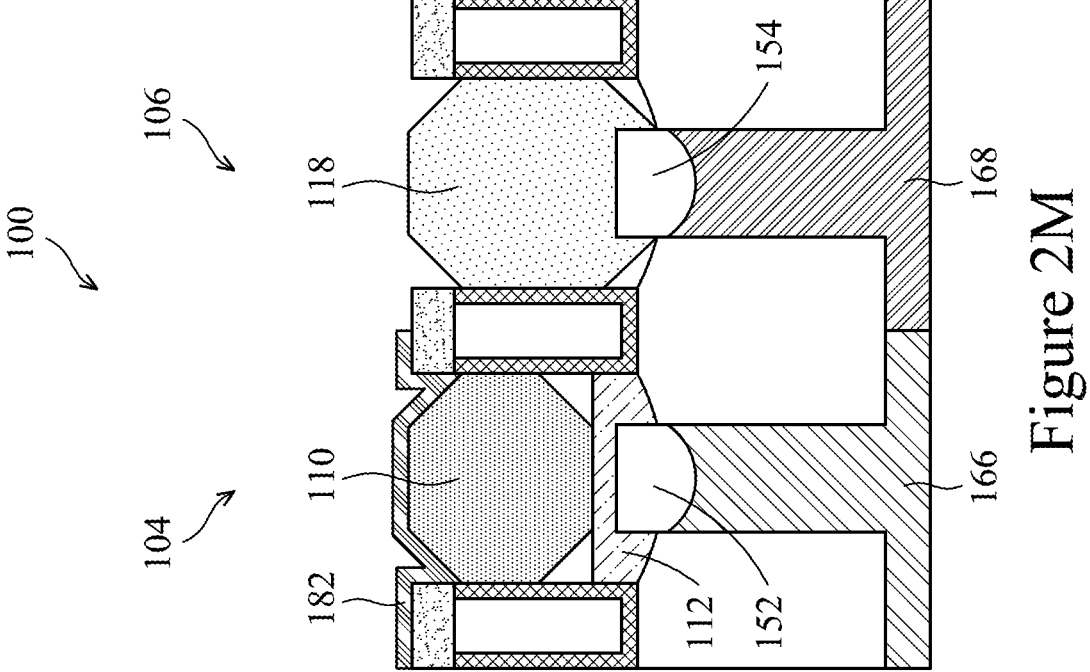
Figure 2N:
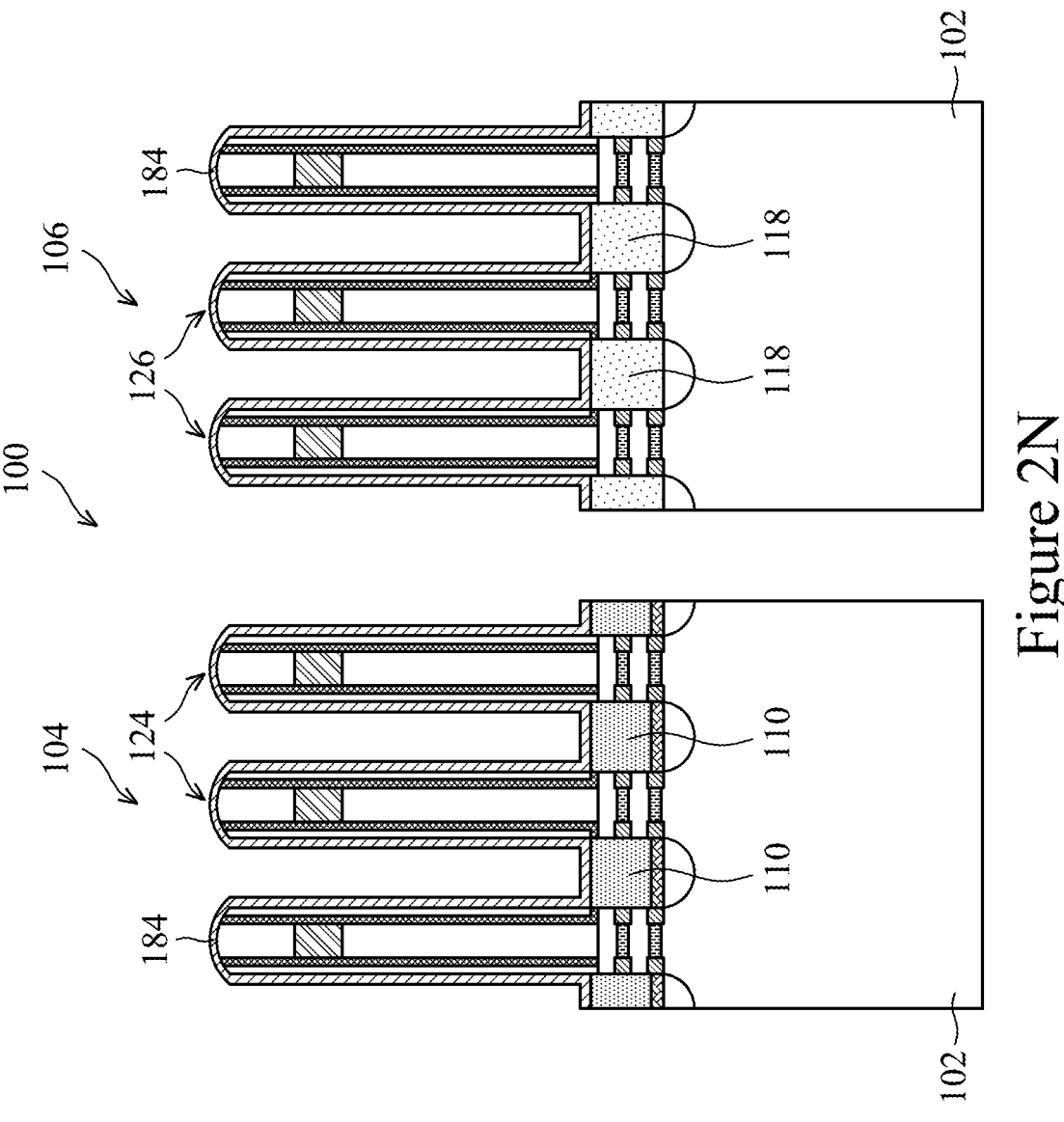
Figure 20:
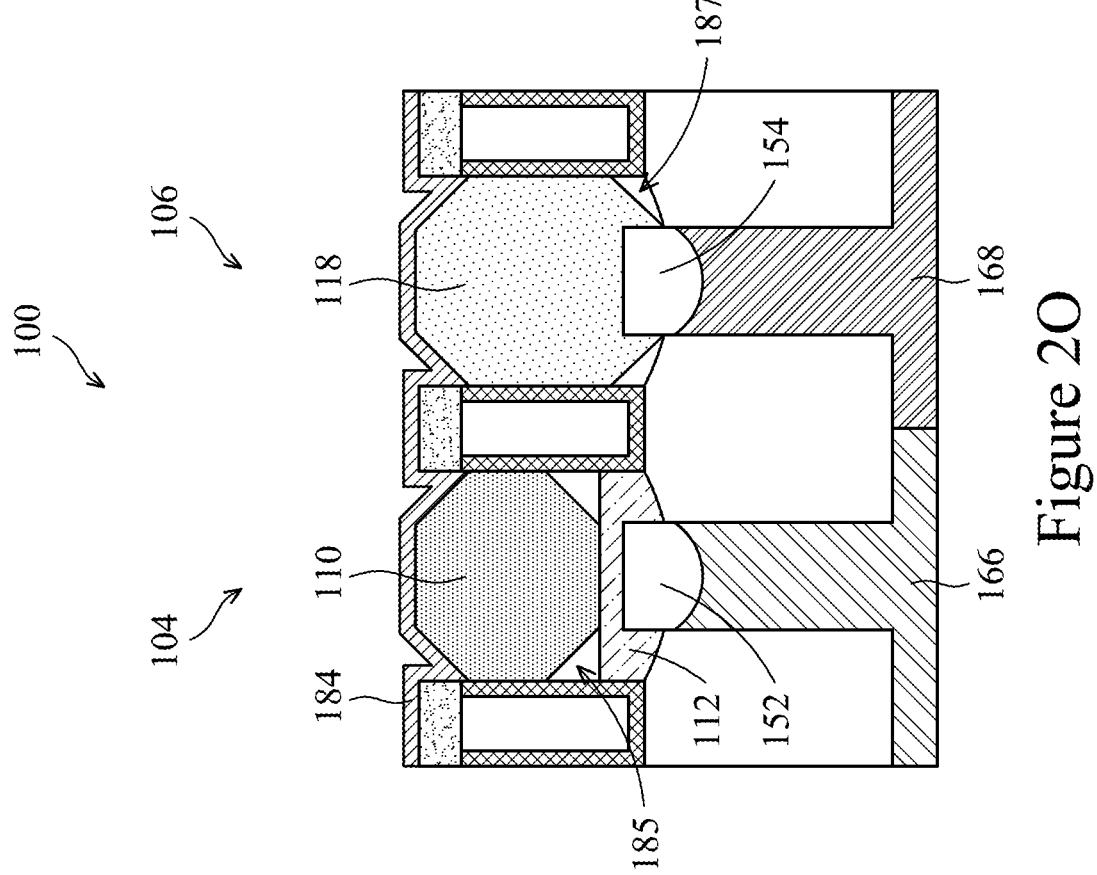
Figure 2P:
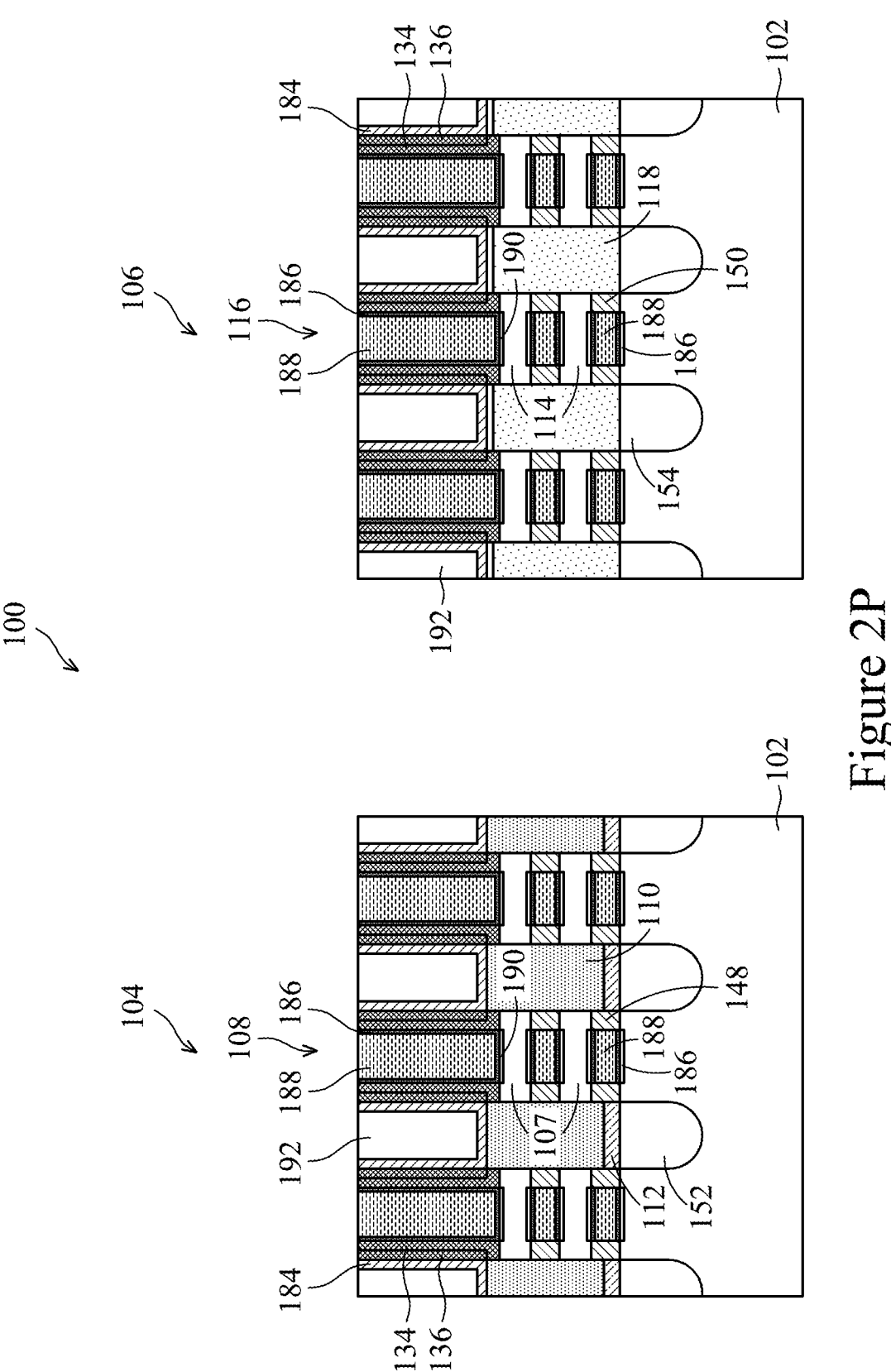
Figure 2Q:
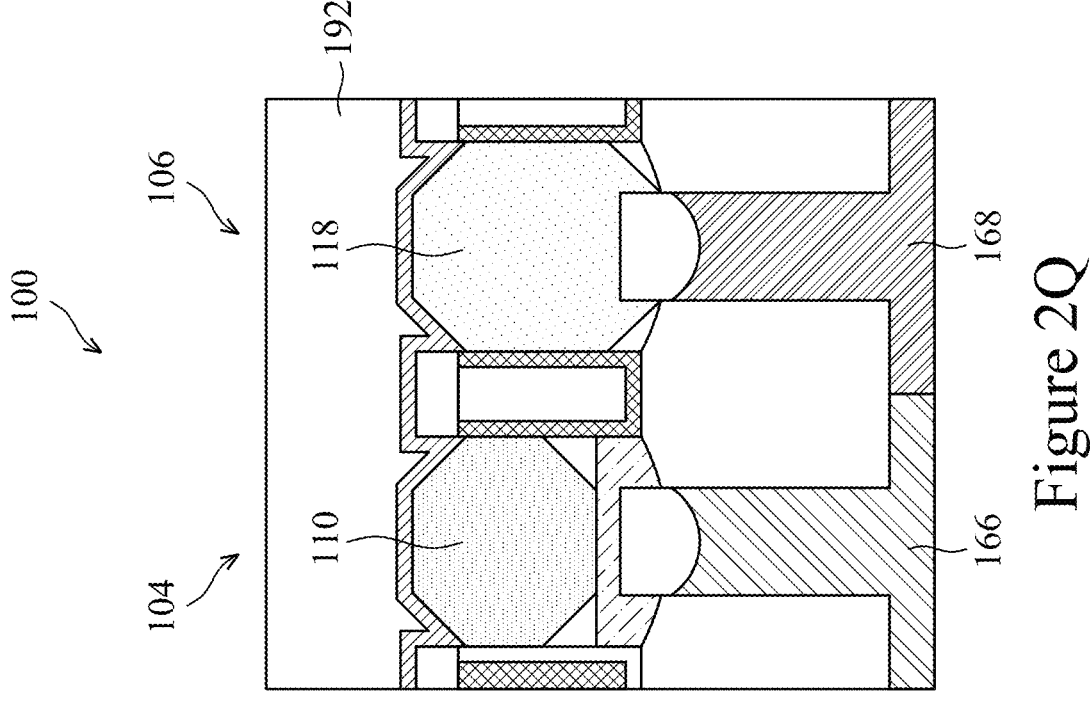

FIGS. 2A-2Q are cross-sectional views of an integrated circuit 100 at various stages of processing, according to some embodiments. FIGS. 2A-2Q illustrate an exemplary process for producing an integrated circuit that includes nanostructure transistors. FIGS. 2A-2Q illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIGS. 2A-2Q each show two different areas of the integrated circuit 100. A first area corresponds to the formation of N-type transistors 104. A second area corresponds to formation of P-type transistors 106. In practice, the first area shows formation of portions of three N-type transistors 104. The second area shows formation of portions of three P-type transistors 106. Layers or structures that are common to both the N-type transistor 104 and the P-type transistor 106 may have a same reference number. Layers, structures, or portions of layers or structures that correspond particularly to either the N-type transistor 104 the P-type transistor 106 may have different reference numbers.

In FIG. 2A the integrated circuit 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for a P-type transistor and phosphorus for an N-type transistor.

The integrated circuit 100 includes a plurality of semiconductor layers 105 and sacrificial semiconductor layers 119 at the regions of the N-type transistors 104. As will be set forth in further detail below, the semiconductor layers 105 will be patterned to form the channel regions of the N-type transistors 104 and the P-type transistors 106. The sacrificial semiconductor layers 119 will eventually be removed.

The semiconductor layers 105 may include one or more layers of Si, Ge, SiGe, GaAs, InSb, GaP, GaSb, InAlAs, InGaAs, GaSbP, GaAsSb or InP. In some embodiments, the semiconductor layers 105 are the same semiconductor material as the substrate 102. Other semiconductor materials can be utilized for the semiconductor layers 105 without departing from the scope of the present disclosure. In a non-limiting example described herein, the semiconductor layers 105 and the substrate 102 are silicon.

The sacrificial semiconductor layers 119 include a different semiconductor material than the semiconductor layers 105. In an example in which the semiconductor layers 105 include silicon, the sacrificial semiconductor layers 119 may include SiGe. In some embodiments, the semiconductor layers 105 and the sacrificial semiconductor layers 119 are formed by alternating epitaxial growth processes from the semiconductor substrate 102. Alternating epitaxial growth processes are performed until a selected number of semiconductor layers 105 and sacrificial semiconductor layers 119 have been formed.

In FIG. 2A, there are three semiconductor layers 105. However, in practice, there may be different numbers different numbers of semiconductor layers 105 than three. For example, each N-type gate all around transistor 104 may include between 2 and 10 semiconductor layers 105. Other numbers of semiconductor layers 105 can be utilized without departing from the scope of the present disclosure.

The vertical thickness of the semiconductor layers 105 can be between 2 nm and 15 nm. As will be set forth in more detail below, semiconductor nanostructure channel regions will be formed from the semiconductor layers 105. The thicknesses described above may enable sufficiently large channel currents while maintaining relatively thin semiconductor nanostructures. The thickness of the sacrificial semiconductor layers 119 can be between 5 nm and 15 nm. Other thicknesses and materials can be utilized for the semiconductor layers 105 and the sacrificial semiconductor layers 119 without departing from the scope of the present disclosure.

In some embodiments, the sacrificial semiconductor layers 119 correspond to a first sacrificial epitaxial semiconductor region having a first semiconductor composition. In subsequent steps, the sacrificial semiconductor layers 119 will be removed and replaced with other materials and structures. For this reason, the semiconductor layers 119 are described as sacrificial.

In FIG. 2A, dummy gate structures 124 have been formed over the semiconductor layers 105 at the area of the first transistors 104. Dummy gate structures 126 have been formed over the semiconductor layers 105 at the area of the second transistors 106. The dummy gate structures 124 are placed on locations at which gate electrodes of the transistors will be placed. Furthermore, the dummy gate structures 124 are positioned at places below which the channel regions of transistors will be defined.

The dummy gate structures 124 and 126 each include a layer of polysilicon 128. The layer of polysilicon 128 can have a thickness between 20 nm and 100 nm. The layer of polysilicon 128 can be deposited by an epitaxial growth, a CVD process, a physical vapor deposition (PVD) process, or an ALD process. Other thicknesses and deposition processes can be used for depositing the layer polysilicon 128 without departing from the scope of the present disclosure.

The dummy gate structures 124 and 126 each include a dielectric layer 130 on the layer of polysilicon 128 and a dielectric layer 132 on the dielectric layer 130. In one example, the dielectric layer 130 includes silicon nitride. In one example, the dielectric layer 132 includes silicon oxide. The dielectric layers 130 and 132 can be deposited by CVD. The dielectric layer 130 can have a thickness between 5 nm and 15 nm. The dielectric layer 132 can have a thickness between 15 nm and 50 nm. Other thicknesses, materials, and deposition processes can be utilized for the dielectric layers 130 and 132 without departing from the scope of the present disclosure.

The dielectric layers 130 and 132 have been patterned and etched to form a hard mask for the layer of polysilicon 128. The dielectric layers 130 and 132 can be patterned and etched using standard photolithography processes. After the dielectric layers 130 and 132 have been patterned and etched to form the hard mask, the layer of polysilicon 128 is etched so that only the polysilicon directly below the dielectric layers 130 and 132 remains. The result is a polysilicon fin.

A spacer layer 134 has been deposited on the polysilicon layer 128 and the dielectric layers 130 and 132. The spacer layer 134 is also deposited on the top surface of the uppermost semiconductor layers 105. The spacer layer can include silicon nitride, SiOCN, or other suitable dielectric layers. The spacer layer 134 can be deposited by CVD, PVD, ALD, or other suitable processes. The spacer layer 134 can have a thickness between 2 nm and 10 nm. The spacer layer 134 can have other materials, deposition processes, and thicknesses without departing from the scope of the present disclosure.

A dielectric layer 136 has been deposited on the spacer layer 134. The dielectric layer 136 can include silicon nitride, SiOCN, or other suitable dielectric layers. The dielectric layer 136 can be deposited by CVD, PVD, ALD, or other suitable processes. The dielectric layer 136 can have a thickness between 2 nm and 10 nm. The dielectric layer 136 may have the same material or a different material from the spacer layer 134. Furthermore, the spacer layer 134 and the dielectric layer 136 may jointly be considered a spacer layer for the dummy gates 124. The dielectric layer 136 can have other materials, deposition processes, and thicknesses without departing from the scope of the present disclosure.

In FIG. 2B, trenches 140 have been formed through the semiconductor layers 105 and the sacrificial semiconductor layers 119. The trenches 140 also extend into the substrate 102. Analogous trenches 142 are formed through the semiconductor layers 105 and sacrificial semiconductor layers 119 and into the substrate 102 at the location of the P-type transistors 106. The trenches 140 and 142 can be formed by performing an anisotropic etch that etches in the downward direction. The anisotropic etch removes the spacer layer 134 and the dielectric layer 136 from the tops of the dummy gates 124 and 126 and from the bottom space between adjacent dummy gates 124 and 126. The anisotropic etch leaves the portions of the spacer layer 134 and the dielectric layer 136 on sidewalls of the dummy gates 124 and 126.

The trenches 140 and 142 define semiconductor fins 144 and 146. Each semiconductor fin 144 corresponds to a respective N-type transistor 104. Each fin 144 includes a plurality of semiconductor nanostructures 107 and sacrificial semiconductor nanostructures 120. The semiconductor nanostructures 107 correspond to remaining portions of the semiconductor layers 105 at the area of the N-type transistors 104. The sacrificial semiconductor nanostructures 120 correspond to the remaining portions of the sacrificial semiconductor layers 119 at the N-type transistors 104. The semiconductor nanostructures 107 correspond to channel regions of the N-type transistors 104. The semiconductor nanostructures 107 can include semiconductor nanosheets, semiconductor nanowires, or other types of semiconductor nanostructures.

Each semiconductor fin 146 includes a plurality semiconductor nanostructures 114 and sacrificial semiconductor nanostructures 122. The semiconductor nanostructures 114 correspond to remaining portions of the semiconductor layers 105 at the P-type transistors 106. The sacrificial semiconductor nanostructures 122 correspond to the remaining portions of the sacrificial semiconductor layers 119 at the P-type transistors 106. The semiconductor nanostructures 114 correspond to channel regions of the P-type transistors 106. The semiconductor nanostructures 114 can include semiconductor nanosheets, semiconductor nanowires, or other types of semiconductor nanostructures. The semiconductor fins 144 and 146 may be part of or extensions from the substrate 102.

The etching process for forming the trenches 140 and 142 can include multiple etching steps. A first etching step may remove the top and bottom portions of the spacer layer 134 and the dielectric layer 136. A second etching step may etch through the semiconductor layers 105, the sacrificial semiconductor layers 119, and the substrate 102. Alternatively, multiple etching steps may be utilized to etch through the semiconductor layers 105 and the sacrificial semiconductor layers 119.

In FIG. 2C a recess step has been performed to recess the sacrificial semiconductor nanostructures 120 and 122. The recessing process removes outer portions of the sacrificial semiconductor nanostructures 120 and 122 without entirely removing the sacrificial semiconductor nanostructures 120 and 122. The recessing process can be performed with an anisotropic etch that selectively etches the material of the sacrificial semiconductor nanostructures 120 and 122 with respect to the materials of the semiconductor nanostructures 107 and 114 and the substrate 102. The anisotropic etching process can include a timed etching process. The duration of the etching process is selected to remove only a portion of the sacrificial semiconductor nanostructures 120 and 122 without entirely removing the sacrificial semiconductor nanostructures 120 and 122.

In FIG. 2C, inner spacer layers 148 have been deposited between the exposed portions of the semiconductor nanostructures 107. In particular, the inner spacer layers 148 are formed at the locations where the sacrificial semiconductor nanostructures 120 have been recessed. The inner spacer layers 148 can be deposited by an ALD process, a CVD process, or other suitable processes. In one example, the inner spacer layers 148 include silicon nitride. Inner spacer layers 150 have been formed in the recesses of the semiconductor nanostructures 122. The inner spacer layers 150 and the inner spacer layers 148 can be formed in a same deposition process. Other materials and deposition processes can be utilized for the inner spacer layers 148 and 150 without departing from the scope of the present disclosure.

In FIG. 2D, epitaxial semiconductor regions 152 and 154 have been formed at the bottom of the trenches 140 and 142 respectively. The epitaxial semiconductor regions 152 and 154 can include intrinsic semiconductor material. The epitaxial semiconductor regions 152 and 154 are grown epitaxially from the substrate 102. The epitaxial semiconductor regions 152 and 154 may include a same material as the semiconductor substrate 102. In some embodiments, while the semiconductor substrate 102 may be doped, the epitaxial semiconductor regions 152 and 154 are not doped. The epitaxial semiconductor regions 152 and 154 may be considered as part of the semiconductor substrate 102. The epitaxial semiconductor regions 152 and 154 correspond to regrowth of the portions of the semiconductor substrate 102 that were etched when forming the trenches 140 and 142. Other processes and materials can be utilized for the epitaxial semiconductor regions 152 and 154 without departing from the scope of the present disclosure.

In FIG. 2E, a dielectric layer 156 has been deposited on the dummy gate structures 124 and 126, on sidewalls of the semiconductor fins 144 and 146, and on top surfaces of the epitaxial semiconductor regions 152 and 154. The dielectric layer 156 can include silicon nitride. Alternatively, the dielectric layer 156 can include Al2O3. The dielectric layer 156 can have a thickness between 3 nm and 5 nm. The dielectric layer 156 can be deposited by CVD, ALD, PVD, or other processes. Other materials, thicknesses, and deposition processes can be utilized for the dielectric layer 156 without departing from the scope of the present disclosure.

In FIG. 2F, a mask 158 has been deposited. The mask 158 has been patterned so that the mask 158 covers the dummy gate structures 126 and the trenches 142 at the P-type transistors 106, while exposing the dummy gate structures 124 and trenches 140 at the N-type transistors 104. The mask 158 can include photo resist has been patterned using standard photolithography processes. Other materials and processes can be utilized for the mask 158 without departing from the scope of the present disclosure.

In FIG. 2F, after the mask 158 has been deposited and patterned, a dopant implantation process is performed. Dopant atoms 159 bombard the integrated circuit 100. The dopant atoms 159 travel substantially straight downward so that the dopant atoms 159 can reach the portions of the dielectric layer 156 at the bottom of the trenches 140. The dopant atoms 159 are embedded into the dielectric layer 156 at the bottom of the trenches 140 and on top of the dummy gate structures 124. Because the dopant atoms 159 travel downward the portions of the dielectric layer 156 on the sidewalls of the dummy gate structures 124 and semiconductor fins 144 do not receive dopant atoms 159. As will be described in further detail in relation to FIG. 2H, the dopant atoms 159 change the properties of the dielectric layer 156 at the bottoms of the trenches 140. The dopant atoms may include ions.

Because the mask 150 is present at the P-type transistors 106, the dopant atoms 159 do not impact any portion of the dielectric layer 156 beneath the mask 158. Accordingly, the properties of the dielectric layer 156 at the bottom of the trenches 142 are not altered. The significance of this is set forth in further detail below.

In some embodiments, the dopant atoms 159 are carbon ions. Accordingly, in an example in which the dielectric layer 156 is silicon nitride, the portions of the dielectric layer 156 at the bottom of the trenches 140 become SiCN. In another example, the dopant atoms 159 are oxygen ions, resulting in the portions of the dielectric layer 156 at the bottom of the trenches becoming SiON. Other suitable types of ions or particles can be used to render the dielectric layer 156 selectively etchable with respect to the transformed portions of the dielectric layer 156 at the bottom of the trenches 140. Accordingly, various other materials can be utilized for the dielectric layer 156 and for the dopant atoms 159 without departing from the scope of the present disclosure. While the description of FIG. 2F describes implantation of dopant atoms 159, dopant species such as compounds or molecules can be utilized.

In FIG. 2G, bottom dielectric regions 112 have been formed from the dielectric layer 156 at the bottom of the trenches 140. The bottom dielectric regions 112 are formed during the ion bombardment process described in relation to FIG. 2F. Formation of the bottom dielectric regions 112 may also include performing a thermal annealing process after ion implantation. The bottom dielectric regions 112 are positioned in direct contact with the substrate 102 at the bottom of the trenches 140. More particularly, the bottom dielectric regions 112 are formed directly on the epitaxial semiconductor regions 152 at the bottom of the trenches 140. Though not shown in FIG. 2G, the portions of the dielectric layer 156 on top of the dummy gate structures 124 may also be transformed to the same material as the bottom dielectric regions 112.

The bottom dielectric region 112 may have a thickness between 2 nm and 10 nm. This thickness may be sufficiently thick to ensure substantially no leakage current, but not so thick as to adversely affect the potential thickness of a source/drain region that will be formed thereon. Other thicknesses can be utilized without departing from the present disclosure.

In FIG. 2H, an etching process has been performed. The etching process removes the dielectric layer 156 from the dummy gate structures 124 and 126 and from the sidewalls of the semiconductor fins. The etching process does not remove the bottom dielectric regions 112. This is because the bottom dielectric regions 112 are of a different material than the dielectric layer 156. Accordingly, the dielectric layer 156 can be selectively etched with respect to the material of the bottom dielectric regions 112. Because the ion implantation process did not affect the dielectric layer 156 at the P-type transistors 106, there is no remaining dielectric material at the bottom of the trenches 142.

Though not shown in FIG. 2H, a dielectric material having the same properties as the bottom dielectric region 112 may remain on the top surfaces of the dummy gate 124. This remaining dielectric material may be removed. Removal of the dummy gates 124 may include a chemical mechanical planarization (CMP) process that removes the top portions of the dummy gate 124. The CMP process may remove the dielectric material on top of the dummy gates 124 without removing the bottom dielectric regions 112.

FIG. 2I corresponds to an alternate cross-sectional view of an N-type transistor 104 and the P-type transistor 106 at the same stage of processing as in FIG. 2H. The cross-sectional view of FIG. 2I can be taken along cut lines I shown in FIG. 2H. For convenience, FIG. 2I illustrates the trenches 140 and 142 associated with transistors 104 and 106 directly adjacent to each other. However, in practice, the transistors 104 and 106 of FIG. 2I are separated from each other in the same manner as in FIG. 2H.

The cross-sectional view of FIG. 2I illustrates dielectric structures 170 that bound the trenches 140 and 142. The dielectric structures may include a dielectric filler material 174, a dielectric spacer material 176, and a dielectric cap 172. The dielectric cap may include hafnium oxide. The dielectric filler material may include silicon oxide. The dielectric spacer material 176 may include SiCN. In particular, the dielectric spacer material 176 may include the same material as the inner spacer layers 148 and 150. Other materials and configurations can be utilized for the dielectric structures 170 without departing from the scope of the present disclosure.

FIG. 2I illustrates the bottom dielectric region 112 positioned at the bottom of the trench 140 directly on the epitaxial semiconductor region 152. In contrast, the bottom dielectric region 112 is not present at the bottom of the trench 142.

FIG. 2I illustrates shallow trench isolation regions 165. The shallow trench isolation regions 165 are not visible in the view of FIG. 2H. The shallow trench isolation regions 165 may include silicon oxide and may be formed by etching the substrate 102 after forming the fins 144 and 146. Other processes and materials can be utilized for the shallow trench isolation regions 165 without departing from the scope of the present disclosure.

FIG. 2I also illustrates a P-well region 166 in the substrate 102. The P-well region 166 is doped with P-type dopants. Accordingly, the P-well region 166 is a region of the semiconductor substrate 102 doped with P-type dopant atoms. The epitaxial semiconductor region 152 is grown from the P-well region 166 but is not doped, aside from a small amount of dopant ions that may diffuse from the P-well region 166 into the epitaxial semiconductor region 152.

FIG. 2I illustrates an N-well region 168 in the substrate 102. The N-well region 168 is doped with N-type dopants. Accordingly, the N-well region 168 is a region of the semiconductor substrate 102 doped with N-type dopant atoms. The epitaxial semiconductor region 154 is grown from the N-well region 168 but is not doped, aside from a small amount the dopant ions that may diffuse from the N-well region 168 into the epitaxial semiconductor region 154.

In FIG. 2J, a dielectric layer 178 has been deposited. After deposition of the dielectric layer 178, photolithography processes are utilized to pattern the dielectric layer 178. In particular, the dielectric layer 178 is removed from the area of the N-type transistors 104. The dielectric layer 178 may include Al2O3 and may be deposited by ALD, CVD, or PVD. The dielectric layer 178 may have a thickness between 3 nm and 10 nm. Other materials, deposition processes, and thicknesses can be utilized for the dielectric layer 178 without departing from the scope of the present disclosure.

After deposition of the dielectric layer 178, source/drain regions 110 are deposited in the trenches 140. The source/drain regions 110 may be grown epitaxially from the semiconductor nanostructures 107. The source/drain regions 110 may be doped in situ with N-type dopant atoms. The source/drain regions 110 of the N-type transistors 104 may include a same material as the semiconductor nanostructures 107. Alternatively, the source/drain regions 110 may include a different material than the semiconductor nanostructures 107. For example, the semiconductor nanostructures 107 may include silicon, while the source/drain regions 110 may include silicon germanium. Other materials and deposition processes can be utilized for the source/drain regions 110 without departing from the scope of the present disclosure.

The source/drain regions 110 are positioned directly on top of the bottom dielectric regions 112. In particular, the bottom surface of each source/drain region 110 is positioned on the top surface of a respective bottom dielectric region 112. The bottom dielectric regions 112 separate the source/drain regions 110 from the semiconductor substrate 102. The presence of the bottom dielectric regions 112 ensures that leakage currents will not flow from the source/drain regions 110 into the semiconductor substrate 102. This can greatly enhance the efficiency of the N-type transistor 104 by substantially eliminating leakage currents. This reduces power consumption and heat generation.

Because the dielectric layer 178 is present at the regions of the P-type transistor 106, the epitaxial growth process does not occur at the regions of the P-type transistor 106.

FIG. 2K corresponds to an alternate cross-sectional view of the integrated circuit 100 at a same stage of processing as in FIG. 2J. The view of FIG. 2K can be taken along the same cut lines I from FIG. 2H, but at the stage of processing of FIG. 2J. The view of FIG. 2K illustrates a source/drain region 110 positioned directly on the bottom dielectric region 112.

In FIG. 2L, a dielectric layer 182 has been deposited. After deposition of the dielectric layer 182, a photolithography process is utilized to pattern the dielectric layer 182. In particular, the dielectric layer 182 is removed from the area of the P-type transistors 106. The dielectric layer 182 may include Al2O3 and may be deposited by ALD, CVD, or PVD. The dielectric layer 182 may have a thickness between 3 nm and 10 nm. Other materials, deposition processes, and thicknesses can be utilized for the dielectric layer 182 without departing from the scope of the present disclosure.

After deposition of the dielectric layer 182, source/drain regions 118 are deposited in the trenches 142. The source/drain regions 118 may be grown epitaxially from the semiconductor nanostructures 114. The source/drain regions 118 may be doped in situ with P-type dopant atoms. The source/drain regions 118 of the P-type transistors 106 may include a same material as the semiconductor nanostructures 114. Alternatively, the source/drain regions 118 may include a different material than the semiconductor nanostructures 114. For example, the semiconductor nanostructures 114 may include silicon, while the source/drain regions 118 may include silicon germanium. Other materials and deposition processes can be utilized for the source/drain regions 118 without departing from the scope of the present disclosure.

The source/drain regions 118 are positioned directly on top of the epitaxial semiconductor regions 154. In particular, the bottom surface of each source/drain region 118 is positioned on the top surface of a respective epitaxial semiconductor region 154. In one example, the semiconductor material of the source/drain regions 118 is different from the semiconductor material of the semiconductor substrate 102. Accordingly, due to a mismatch in the crystal lattice is of the semiconductor substrate 102 and the source/drain regions 118, the semiconductor substrate 102 imparts a strain to the source/drain regions 118. The strain improves the conductivity of the source/drain regions 118. The strain may include a tensile strain or a compressive strain. Because the bottom dielectric regions 112 are not present at the P-type transistors 106, the source/drain regions 118 can be grown directly from the semiconductor substrate 102 and can receive the beneficial strain as described above.

FIG. 2M corresponds to an alternate cross-sectional view of the integrated circuit 100 at the same stage of processing as in FIG. 2L. The view of FIG. 2M can be taken along the same cut lines I from FIG. 2H, but at the stage of processing of FIG. 2L. The view of FIG. 2M illustrates a source/drain region 118 positioned directly on epitaxial semiconductor region 154.

In FIG. 2N, a dielectric cap layer 184 has been deposited. The dielectric cap layer 184 covers the dummy gate's 124 and 126 and the source/drain regions 110 and 118. The dielectric cap layer 184 can include silicon nitride. The dielectric cap layer 184 can be deposited by CVD, ALD, or PVD and can have a thickness between 2 nm and 10 nm. Other deposition processes, materials, and thicknesses can be utilized for the dielectric cap layer without departing from the scope of the present disclosure. FIG. 2O is the alternate cross-sectional view taken along cut lines I as described previously, but at the stage of processing of FIG. 2M. FIG. 2O illustrates the dielectric cap layer 184 positioned on the source/drain region 110 and 118. FIG. 2O also illustrates air gaps 185 between the source/drain regions 110 and the bottom dielectric regions 112. The air gaps 185 may have a flat bottom when the bottom dielectric regions have a flat top surface. Air gaps 187 may be present between the source/drain regions 118 and the shallow trench isolation regions 165. The air gaps 187 and 185 may have difference shapes due to the sloped top surface of the shallow trench isolation regions 165. Furthermore, the air gaps 185 are positioned higher than the air gaps 187 due to the presence of the bottom dielectric regions 112.

In FIG. 2P, the N-type transistor 104 and the P-type transistor 106 have been finished. In particular, a dielectric layer 192 has been deposited on the dielectric layer 184. The dielectric layer 192 fills the remaining portion of the trenches 140 and 142 above the source/drain regions 110 and 118. The dielectric layer 192 may include silicon dioxide. After deposition of the dielectric layer 192, a CMP process is performed to reduce the height of the dummy gate 124 and 126 by removing the dielectric layers 130 and 132 and exposing the polysilicon layer 128. The polysilicon layer 128 is then removed. After removal of the polysilicon layer 128, the sacrificial semiconductor nanostructures 120 and 122 are removed with an etching process that selectively removes the sacrificial semiconductor nanostructures 120 and 122 with respect to the semiconductor nanostructures 107 and 114.

After removal of the sacrificial semiconductor nanostructures 120 and 122, a gap remains where the sacrificial semiconductor nanostructures 120 and 122 were. The semiconductor nanostructures 107 and 114 are exposed. A gate dielectric layer 190 is deposited surrounding the semiconductor nanostructures 107 and 114. The gate dielectric layer 190 may include an interfacial dielectric layer and the high K dielectric layer. The interfacial dielectric layer may include silicon oxide of a thickness between 2 Å and 10 Å. The high K dielectric layer is deposited on the interfacial dielectric layer and may include hafnium oxide. The high K dielectric layer may have a thickness between 5 Å and 20 Å. The materials of the gate dielectric layer 190 may be deposited by ALD, CVD, or PVD. Other structures, materials, thicknesses, and deposition processes may be utilized for the gate dielectric layer 190 without departing from the scope of the present closure.

After deposition of the gate dielectric layer 190 around the semiconductor nanostructures 107 and 114, gate electrodes 108 and 116 are formed. The gate electrode 108 is formed at the N-type transistor 104. The gate electrode 116 is formed at the P-type transistor 106. The gate electrode 108 may include a gate liner layer 186 and a gate fill material 188. The gate liner 186 can include a metal such as titanium, tantalum, titanium nitride, tantalum nitride, or other suitable materials. The gate liner 186 can be deposited by ALD, PVD, or CVD may have a thickness between 2 nm and 5 nm. The gate fill material 188 may include a metal such as tungsten, copper, aluminum, titanium, gold, or other suitable conductive materials. The gate fill material 188 may be deposited by ALD, PVD, or CVD. The gate fill material 188 fills all remaining spaces around the semiconductor nanostructures 107 and 114 and fills the remaining spaces vacated by removal of the polysilicon layer 128. Other materials, thicknesses, deposition processes, and structures can be utilized for the gate electrodes 108 and 116 without departing from the scope of the present disclosure. In practice, the gate electrode 108 and the gate electrode 116 may have different compositions. In particular, different numbers of layers and metals may be utilized for the gate electrodes 108 and 116 in order to achieve desired threshold voltages for the transistors 104 and 106.

FIG. 2P illustrates three N-type transistors 104 and three P-type transistors 106, though reference numbers are shown for only a single N-type transistor 104 and a single P-type transistor. While the source/drain regions 110 and 118 has been described, in practice, each transistor 104 and each transistor 106 have a source region and a drain region. In one example, the central N-type transistor 104 may have a source region 110 on the left and a drain region 110 on the right or vice versa. The central P-type transistor 106 may have a source region 118 on the left and a drain region 118 on the right or vice versa.

FIG. 2Q is a cross-sectional view of the integrator one circuit 100 at the stage of processing of FIG. 2P, but taken along cut lines I from FIG. 2H, though at the processing stage of FIG. 2P. The view of FIG. 22 illustrates the dielectric layer 192 over the source/drain regions 110 and 118.

Figures 3A, 3B, 3C:
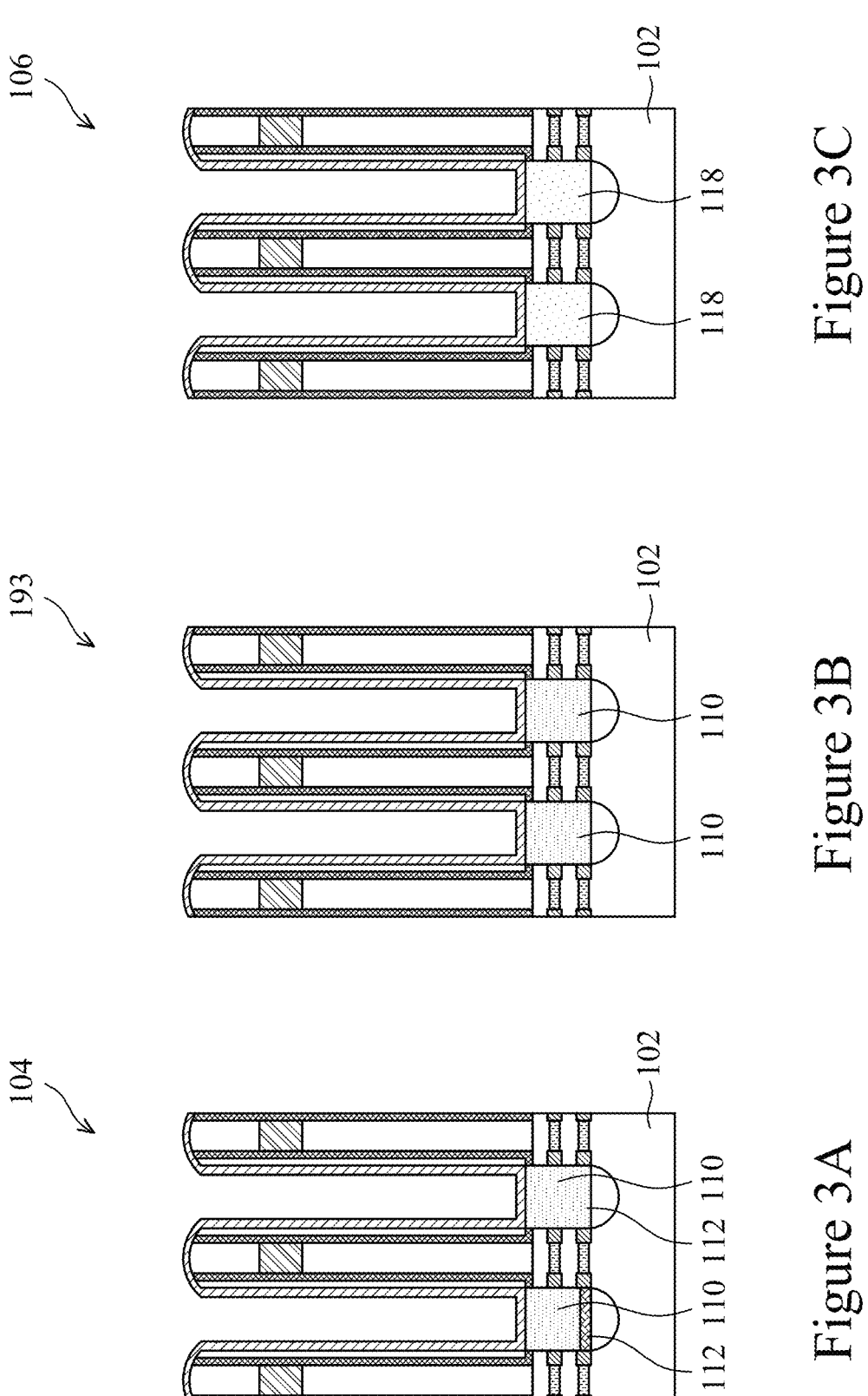
FIGS. 3A-3F are cross-sectional views of various transistors of an integrated circuit, in accordance with some embodiments.

FIGS. 3A-3F illustrate various nanostructure transistors of an integrated circuit 100 at the stage of processing corresponding to FIG. 2N. FIG. 3A illustrates an N-type transistor 104 including the bottom dielectric region 112 below the source/drain regions 110. The transistor 104 of FIG. 3A is a shorter channel device with a pitch between 20 nm and 70 nm, though other dimensions can be utilized without departing from the scope of the present disclosure. The relatively small pitch enables the formation of the bottom dielectric region 112.

The transistor 106 of FIG. 3B corresponds to the P-type transistor 106 of FIG. 2N. The P-type transistor 106 is a shorter channel device having a pitch between 20 nm and 70 nm, though other dimensions can be used without departing from the scope of the present disclosure. As described previously, the bottom dielectric region 112 is not present for the P-type transistor 106.

The transistor 191 of FIG. 3C is an N-type transistor in which the source/drain regions 110 are doped with P-type dopants. The transistor 191 operates as a pickup transistor that discharges current from the source/drain region into the substrate 102 and is not configured with the bottom dielectric region 112.

Figures 3D, 3E, 3F:
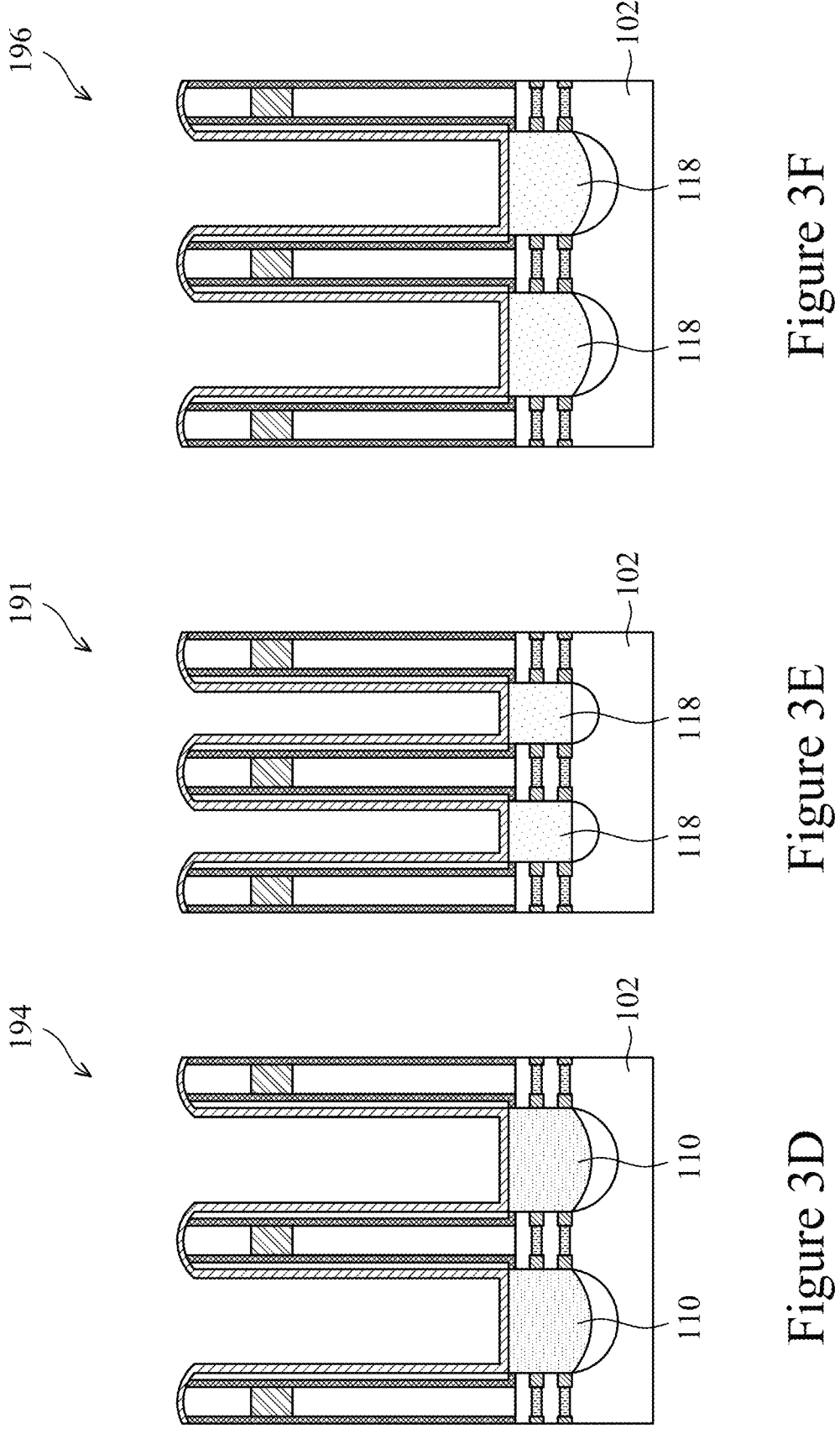

The transistor 193 of FIG. 3D is P-type transistor in which the source/drain regions 118 are doped with N-type dopants. The transistor 193 operates as a pickup transistor that discharges current from the source/drain region into the substrate 102 and is not configured with the bottom dielectric region 112.

The transistor 194 of FIG. 3E is a long channel N-type transistor having a pitch greater than 70 nm. Due to the large pitch, it may not be practical to form the bottom dielectric region 112 for the transistor 194. Accordingly, the bottom dielectric region 112 is not present for the long channel transistor 194. Alternatively, a bottom dielectric region 112 can also be formed for the long channel transistor 194.

The transistor 196 of FIG. 3F is a long channel P-type transistor having a pitch greater than 70 nm. The P-type transistor 196 benefits from the strain imparted from the crystallized mismatch between the substrate 102 and the source/drain regions 118. Accordingly, the bottom dielectric region 112 is not present for the long channel transistor 196.

The transistors 104, 106, 191, 193, 194, and 196 may be formed on the same wafer at the same time. The presence or absence of the bottom dielectric region 112 can be achieved patterning the mask 158 of FIG. 2F to expose the areas where transistor should be formed with the bottom dielectric region 112. In the example of FIGS. 3A-3F, the mask 158 with only expose the area of the transistor 104. Alternatively, the bottom dielectric region 112 can be formed for transistors other than or in addition to the transistor 104.

Figure 4:
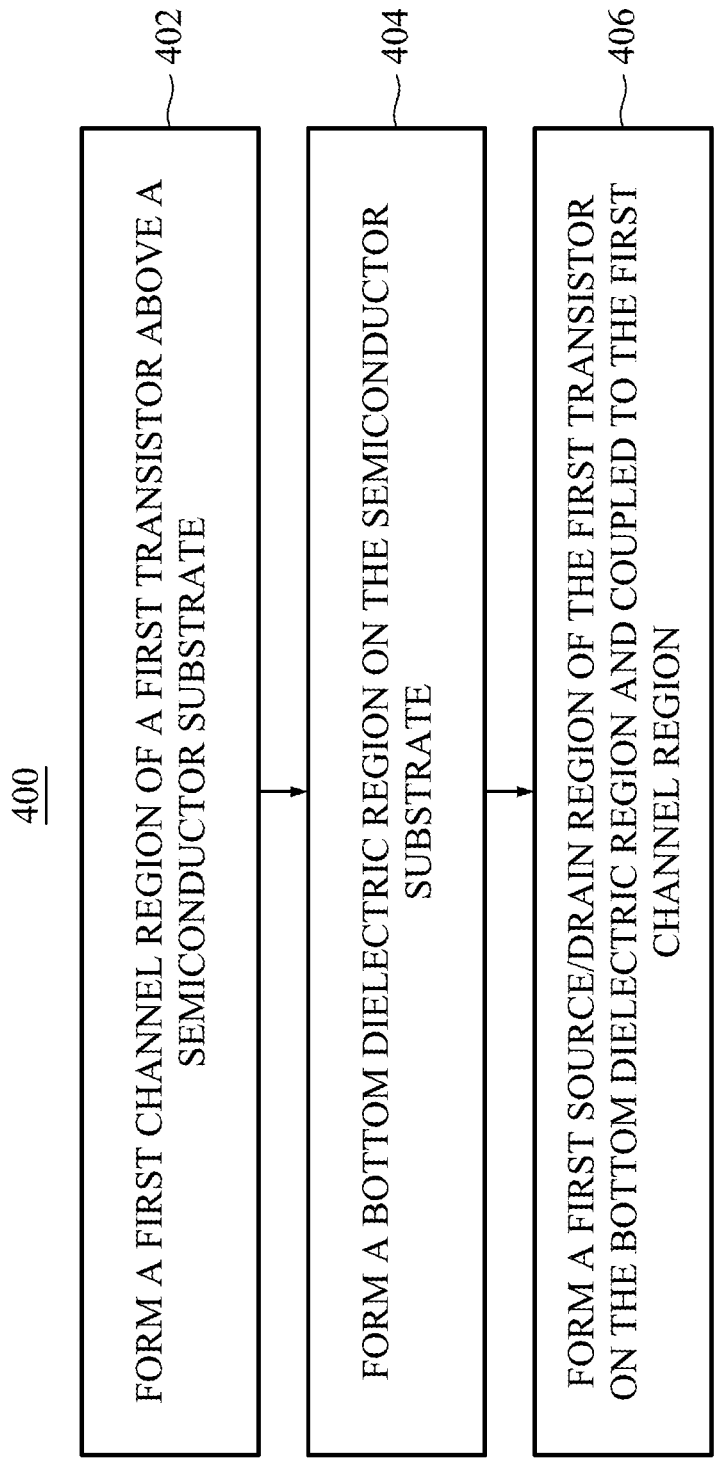
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1-3G. At 402, the method 400 includes forming a first channel region of a first transistor above a semiconductor substrate. One example of a semiconductor substrate is the semiconductor substrate 102 of FIG. 1. One example of a first transistor is the transistor 104 of FIG. 1. One example of a first channel region is the channel region 107 of FIG. 1. At 404, the method 400 includes forming a bottom dielectric region on the semiconductor substrate. One example of a bottom dielectric region is the bottom dielectric region 112 of FIG. 1. At 406, the method 400 includes forming a first source/drain region of the first transistor on the bottom dielectric region and coupled to the first channel region. One example of a first source/drain region is the source/drain region 110 of FIG. 1.

FIG. 5 is a flow diagram of a method 500 for forming an integrated circuit, in accordance with some embodiments. The method 500 can utilize processes, structures, and components described in relation to FIGS. 1-4. At 502, the method 500 includes forming, over a semiconductor substrate, a first fin including a plurality of semiconductor nanostructures collectively corresponding to a first channel region of a first gate all around transistor. One example of a semiconductor substrate is the semiconductor substrate 102 of FIG. 2J. One example of a first fin is a fin 144 of FIG. 2J. One example of semiconductor nanostructures are the semiconductor nanostructures 107 of FIG. 2J. One example of a gate all around transistor is the gate all around transistor 104 of FIG. 2J. At 504, the method 500 includes forming, over the semiconductor substrate, a second fin separated from the first fin by a first trench and including a plurality of second semiconductor nanostructures collectively corresponding to a second channel region of a second gate all around transistor. One example of a second fin is another of the fins 144 of FIG. 2J. One example of a trench is the trench 140 of FIG. 2J. At 506, the method 500 includes depositing a bottom dielectric region at a bottom of the first trench on the semiconductor substrate. One example of a bottom dielectric region is the bottom dielectric region 112 of FIG. 2J. At 508, the method 500 includes depositing a source/drain region of the first and second gate all around transistors on the bottom dielectric region. One example of a source/drain region is a source/drain region 110 of FIG. 2J.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions above the semiconductor substrate and in contact with the nanostructures. Embodiments of the present disclosure reduce leakage currents from the source/drain regions by forming a bottom dielectric region between a bottom of the source/drain regions and the semiconductor substrate. The bottom dielectric regions prevent the flow of leakage currents from the source/drain regions to the semiconductor substrate because no current will flow through the bottom dielectric regions. This can greatly improve the overall functionality of the integrated circuit by substantially eliminating a major source of power consumption. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

In some embodiments, an integrated circuit includes a semiconductor substrate and a first transistor. The first transistor includes a first channel region, a first source/drain region above the semiconductor substrate and coupled to the first channel region, and a bottom dielectric region in contact with a bottom of the first source/drain region and separating the first source/drain region from the semiconductor substrate.

In some embodiments, a method includes forming a first channel region of a first transistor above a semiconductor substrate, forming a bottom dielectric region on the semiconductor substrate, and forming a first source/drain region of the first transistor on the bottom dielectric region and coupled to the first channel region.

In some embodiments, a method includes forming, over a semiconductor substrate, a first fin including a plurality of semiconductor nanostructures collectively corresponding to a first channel region of a first gate all around transistor. The method includes forming, over the semiconductor substrate, a second fin separated from the first fin by a first trench and including a plurality of second semiconductor nanostructures collectively corresponding to a second channel region of a second gate all around transistor. The method includes depositing a bottom dielectric region at a bottom of the first trench on the semiconductor substrate and depositing a source/drain region of the first and second gate all around transistors on the bottom dielectric region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a plurality of stacked first channels of a first transistor above a semiconductor substrate;

forming a plurality of stacked second channels of a second transistor above the semiconductor substrate;

forming a plurality of inner spacers interleaved with the first channels;

depositing a dielectric layer on sidewalls of the first channels, on sidewalls of the inner spacers, and on the semiconductor substrate at a bottom of a first source/drain trench;

changing a composition of a first portion of the dielectric layer at the bottom of the trench relative to a second portion of the dielectric layer on the sidewalls of the first channels and inner spacers by performing a dopant implantation process;

forming a bottom dielectric region on the semiconductor substrate from the first portion of the dielectric layer by selectively etching, with an etching process, the second portion of the dielectric layer with respect to the first portion;

forming a first source/drain region of the first transistor in the first source/drain trench on the bottom dielectric region and coupled to the first channels; and forming a second source/drain region of the second transistor in direct contact with the semiconductor substrate and coupled to the second channel regions.

2. The method of claim 1, wherein forming the bottom dielectric region includes:

depositing the dielectric layer on sidewalls of the second channels and on the semiconductor substrate at the bottom of a second source/drain trench;

entirely removing the dielectric layer from the sidewalls of the second channels and the bottom of the second source/drain trench with the etching process.

3. The method of claim 2, further comprising covering the dielectric layer in the second source/drain trench with a mask layer during the dopant implantation process.

4. The method of claim 1, wherein forming the first source/drain region includes epitaxially growing a first epitaxial feature over the semiconductor substrate, epitaxially growing a second epitaxial feature from the first channel region, and epitaxially growing a third epitaxial feature over the first epitaxial feature.

5. The method of claim 4, wherein forming the bottom dielectric region is after epitaxially growing the first epitaxial feature.

6. The method of claim 1, wherein the first transistor is an N-type transistor and the second transistor is a P-type transistor.

7. A method, comprising:

defining, from a first semiconductor fin, a stack of first channels of a first gate all around transistor and a stack of second channels of a second gate all around transistor by forming a first trench in the semiconductor fin;

defining, from a second semiconductor fin, a stack of third channels of a third transistor by forming a second trench in the second semiconductor fin; forming a plurality of inner spacers interleaved with first channels; depositing a dielectric layer in the first trench and the second trench;

changing a composition of a first portion of the dielectric layer at the bottom of the first trench relative to a second portion of the dielectric layer on the sidewalls of the first channels and inner spacers and in the second trench by performing a dopant implantation process;

forming, from the first portion of the dielectric layer, a bottom dielectric region at the bottom of the first trench on the semiconductor substrate by selectively etching, with an etching process, the second portion of the dielectric layer with respect to the first portion;

forming a source/drain region of the first and second gate all around transistors on the bottom dielectric region;

and forming a second source/drain region of the third gate all around transistors in direct contact with the semiconductor substrate in the second trench.

8. The method of claim 7, further comprising:

defining, in the second semiconductor fin, stacked fourth channels of a fourth gate all around transistor by forming the second trench in the semiconductor fin, the second source/drain region being coupled to the fourth channels.

9. The method of claim 8, wherein the first and second gate all around transistors are N-type transistors and the third and fourth gate all around transistors are P-type transistors.

10. The method of claim 8, wherein the semiconductor substrate imparts a strain to the second source/drain region.

11. A method, comprising:

forming a plurality of first stacked channels of a first transistor of a first conductivity type above a semiconductor substrate;

forming a plurality of second stacked channels of a second transistor of a second conductivity type above the semiconductor substrate;

forming a plurality of first inner spacers interleaved with the first channels and a plurality of second inner spacers interleaved with the second channels;

depositing a dielectric layer on sidewalls of the first and second channels sidewalls of the first and second inner spacers, on the semiconductor substrate;

forming, from the dielectric layer, a bottom dielectric region on the semiconductor substrate adjacent to the first channels by:

changing a composition of a portion of the dielectric layer on the semiconductor substrate adjacent to the first channels by performing a dopant implantation process; and removing the dielectric layer from sidewalls of the first and second channels, the sidewalls of the first and second inner spacers, and from the semiconductor substrate adjacent to the second channels;

forming a first source/drain region of the first transistor above the semiconductor substrate and separated from the semiconductor substrate by the bottom dielectric region; and forming a second source/drain region of the second transistor in direct contact with an intrinsic semiconductor region of the semiconductor substrate adjacent to the second channels.

12. The method of claim 11, wherein the first conductivity type is N-type and the second conductivity type is P-type.

13. The method of claim 11, wherein the bottom dielectric region and the first source/drain region are laterally bounded by a first dielectric structure and a second dielectric structure.

14. The integrated circuit of claim 12, wherein the semiconductor substrate imparts a strain to the second source/drain region.

15. The integrated circuit of claim 12, wherein a bottommost surface of the first source/drain region is higher than a bottommost surface of the second source/drain region.

16. The integrated circuit of claim 12, wherein the semiconductor substrate includes a topmost surface of the first source/drain region substantially planar to a topmost surface of the second source/drain region.

17. The method of claim 11, comprising forming a gate electrode wrapped around the first channels.

18. The method of claim 11, wherein a topmost surface of the bottom dielectric region is above a topmost surface of the semiconductor substrate and a bottommost surface of the bottom dielectric region is lower than the topmost surface of the semiconductor substrate.

19. The method of claim 11, wherein the bottom dielectric region is between 2 nm and 10 nm thick.

20. The method of claim 11, wherein the bottom dielectric region includes a doped silicon nitride.

* * * * *